(12) United States Patent
Nuriya et al.

(10) Patent No.: US 9,301,418 B2
(45) Date of Patent: Mar. 29, 2016

(54) WATERPROOF CONTROL UNIT AND METHOD OF ASSEMBLING THE SAME

(71) Applicant: Mitsubishi Electric Corporation, Chiyoda-ku, Tokyo (JP)

(72) Inventors: Nobuaki Nuriya, Chiyoda-ku (JP); Mitsunori Nishida, Chiyoda-ku (JP); Osamu Nishizawa, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 71 days.

(21) Appl. No.: 14/454,264

(22) Filed: Aug. 7, 2014

(65) Prior Publication Data

US 2015/0216070 A1 Jul. 30, 2015

(30) Foreign Application Priority Data

Jan. 24, 2014 (JP) .................................. 2014-010935

(51) Int. Cl.
*G06F 1/16* (2006.01)
*H05K 7/14* (2006.01)
*B32B 37/00* (2006.01)
*B32B 37/12* (2006.01)
*B32B 37/18* (2006.01)
(Continued)

(52) U.S. Cl.
CPC .......... *H05K 7/1427* (2013.01); *B32B 37/0076* (2013.01); *B32B 37/1292* (2013.01);
(Continued)

(58) Field of Classification Search
USPC ............. 345/8, 633, 589, 156, 419, 501, 211, 345/204, 111, 108, 87, 88, 175; 361/696, 361/679.02, 679.32, 679.08, 679.09, 361/679.52, 679.26, 679.47, 679.54, 361/679.31, 679.33; 174/547, 650, 481, 174/23 R, 50, 17 R, 541, 520; 455/572, 573, 455/99, 345, 457, 307, 575.8, 575.7, 575.4, 455/556.2, 575.1; 165/43, 70, 42, 202, 244, 165/104.33, 104.34, 80.3; 362/237, 267, 362/235, 294, 187, 373, 218, 191, 206, 362/249.01, 249.16

See application file for complete search history.

(56) References Cited

U.S. PATENT DOCUMENTS

| 2013/0005411 A1* | 1/2013 | Kitamura ............ H04M 1/0237 455/575.4 |
| 2014/0083761 A1* | 3/2014 | Wee ........................ H05K 5/069 174/650 |
| 2014/0362206 A1* | 12/2014 | Kossin ................. H04N 5/2252 348/81 |

FOREIGN PATENT DOCUMENTS

| JP | 2001266997 A | 9/2001 |
| JP | 2006100252 A | 4/2006 |

(Continued)

OTHER PUBLICATIONS

Communication dated Nov. 11, 2014, issued by the Japanese Patent Office in counterpart Application No. 2014010935.

*Primary Examiner* — Hung Duong
(74) *Attorney, Agent, or Firm* — Sughrue Mion, PLLC; Richard C. Turner

(57) ABSTRACT

In a waterproof control unit (100A) in which a part of a connector housing (330A) mounted on a circuit board (300A) is exposed and the circuit board (300A) is hermetically housed in a casing including a base (200A) and a cover (400A), in a gap between the cover and the connector housing, a waterproof sealing material (501) is applied to a first sealing gap defined by outer-step flat portions (401*a*,301*a*), slope portions (401*b*,301*b*), and inner-step flat portions (401*c*,301*c*), and in a gap between the base (200A) and the connector housing (330A) or between the base (200A) and the cover (400A), a waterproof sealing material (502,503) is applied to a second or third sealing gap defined by convexo-concave sealing surfaces having a convex thread loosely fitted into a concave thread.

18 Claims, 13 Drawing Sheets

(51) Int. Cl.
 *H05K 5/00* (2006.01)
 *H05K 5/06* (2006.01)

(52) U.S. Cl.
 CPC .............. *B32B37/18* (2013.01); *H05K 5/0052* (2013.01); *H05K 5/062* (2013.01); *B32B 2307/7265* (2013.01); *B32B 2457/00* (2013.01); *B32B 2605/08* (2013.01)

(56) References Cited

FOREIGN PATENT DOCUMENTS

| | | |
|---|---|---|
| JP | 2009-70855 A | 4/2009 |
| JP | 2009-123558 A | 6/2009 |
| JP | 2013-4611 A | 1/2013 |

* cited by examiner

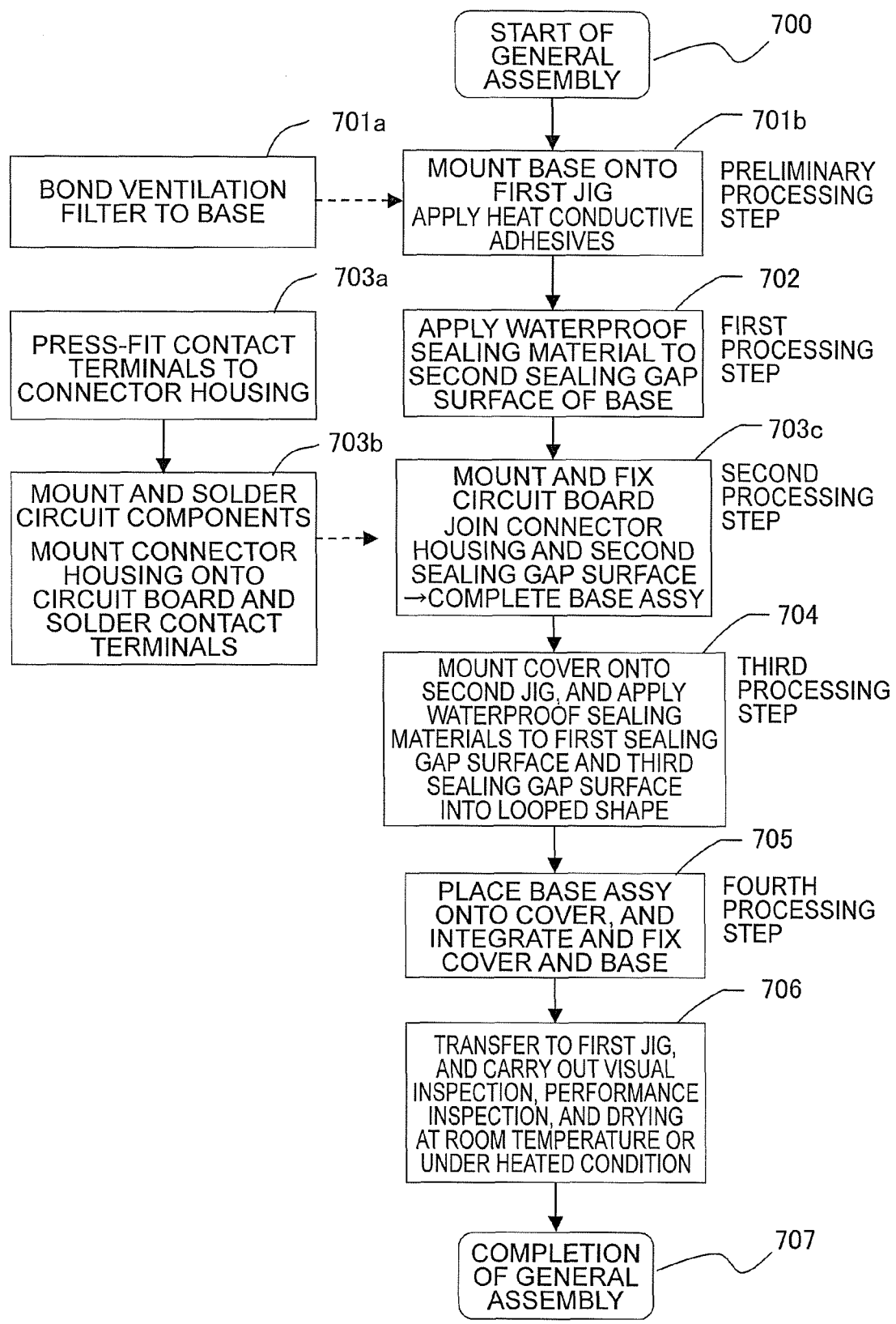

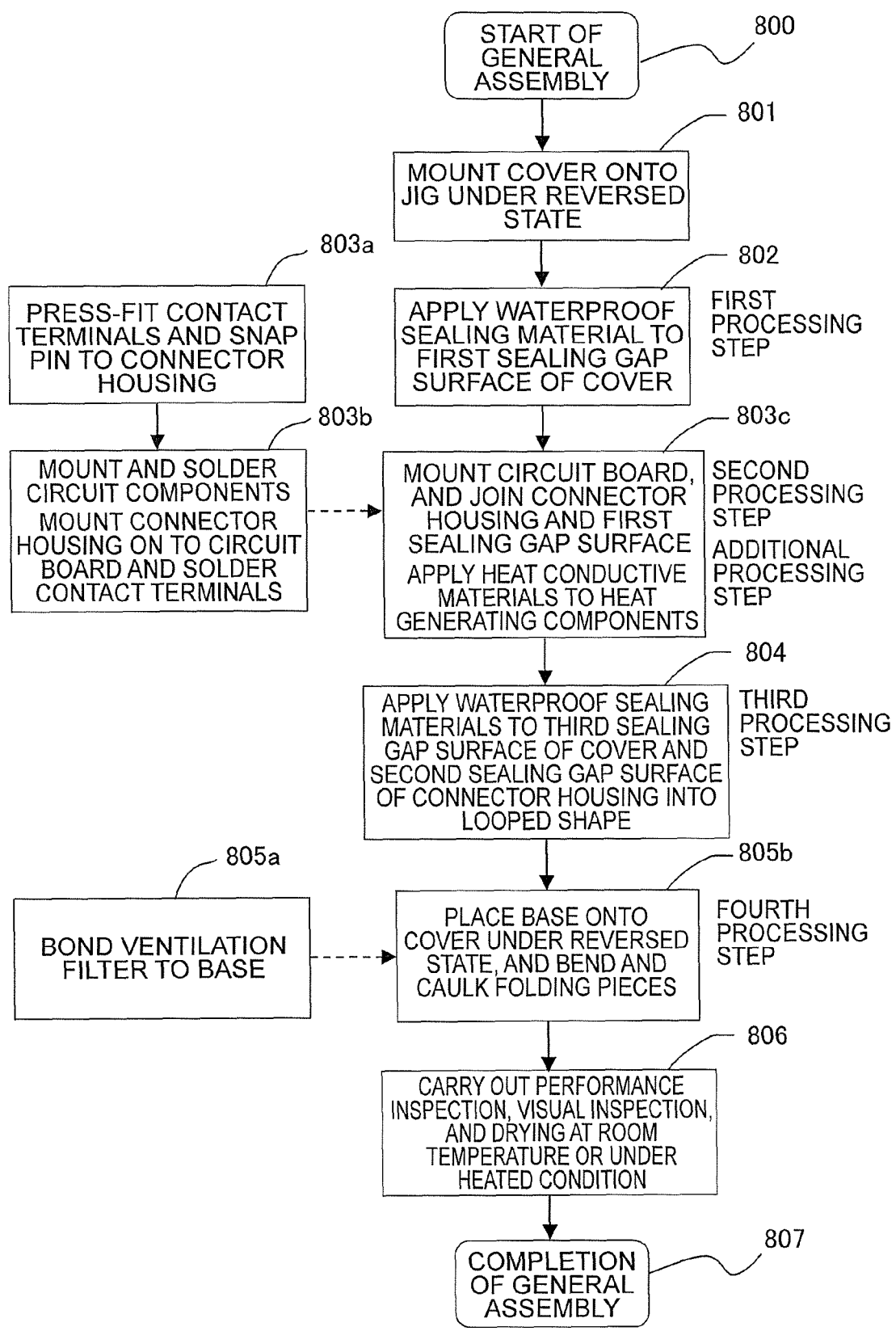

WATERPROOF CONTROL UNIT AND METHOD OF ASSEMBLING THE SAME

BACKGROUND OF THE INVENTION

1. Field of the Invention

The present invention relates to an improvement of a waterproof control unit, which is an on-vehicle electronic control device to be mounted in, for example, an engine compartment, and also relates to an improvement of a method of assembling the waterproof control unit.

2. Description of the Related Art

There have been widely used waterproof control units including a casing including a base and a cover and a circuit board hermetically housed in the casing, onto which a circuit component and a plurality of external connection contact terminals are mounted, and a connector housing made of a resin forming material is positioned and fixed, in which, in order to expose, from the casing, an end surface of the connector housing having the plurality of contact terminals passing therethrough, waterproof sealing materials filled into a first sealing gap defined between abutment surfaces of the connector housing and the cover, a second sealing gap defined between abutment surfaces of the connector housing and the base, and a third sealing gap defined between abutment surfaces of the base and the cover, respectively, are provided.

Further, as waterproof sealing surfaces, for example, there has been widely used a convexoconcave sealing surface system including convex-concave-convex threads formed in an outer peripheral contour portion of the cover, concave-convex-concave threads formed in an outer peripheral contour portion of the base, and a waterproof sealing material filled into a convexoconcave sealing gap defined by loosely fitting the convex thread on one side into the concave thread on the other side. In this case, as sealing surfaces of the connector housing interposed between the cover and the base, it is necessary to form the concave-convex-concave threads on the cover side, and to form the convex-concave-convex threads on the base side. Therefore, it is necessary to provide two types of convexoconcave sealing surfaces in the connector housing.

The first feature of the convexoconcave sealing surface system is that a long water sealing distance (sealing path) is secured even when the sealing width is small. The second feature of the convexoconcave sealing surface system is that, even when one convex thread wall surface abuts on one concave thread wall surface due to an assembly dimension error between the cover and the base so that the film thickness of the waterproof sealing material becomes zero, the waterproof sealing material is filled in a gap between the other convex thread wall surface and the other concave thread wall surface, and hence a predetermined amount of the waterproof sealing material is securely filled between the wall surfaces on any side.

On the other hand, the first drawback of the convexoconcave sealing surface system is as follows. That is, it is necessary to provide two types of convexoconcave sealing surfaces in the connector housing as described above, and hence the connector housing has a long body dimension and a plurality of contact terminals press-fitted to the connector housing also have a long dimension. Therefore, it is necessary to take measures so as to prevent increase in electric resistance.

The second drawback of the convexoconcave sealing surface system is that an apparent thickness dimension between the sealing surfaces becomes larger so as to secure a fitting depth of the convexoconcave surfaces. The third drawback of the convexoconcave sealing surface system is as follows.

That is, when the cover is formed by, for example, sheet metal working, it is difficult to forma narrow, deep, and precise convexoconcave surface. Even when the cover is formed of resin, from the viewpoint of the life of a die, it is impossible to form an extremely narrow and deep convexoconcave surface. Thus, there is a limitation on downsizing to be expected. When the load on the die is to be reduced, the connector housing may have a long body.

For example, referring to FIGS. 1 and 3 of an "electronic device" disclosed in Japanese Patent Application Laid-open No. 2009-070855, a printed circuit board 40 having a connector mounted thereonto is housed in a casing of the electronic device and an inner space of the casing is waterproofed. In an upper case 20 (corresponding to the cover) and a lower case 30 (corresponding to the base) of the casing, as a sealing part that comes in contact with a sealing member, a second recess part 35b is formed in one open side portion, and a second protruding part 25b is formed in the other open side portion. At a surface portion of a housing 51 that faces the open side portions, as a looped sealing part that comes in contact with the sealing member, a connector-side protruding portion 54 to be inserted into the second recess part 35b under a state in which the sealing member is arranged therein and a connector-side recess portion 53 into which the second protruding part 25b is to be inserted under a state in which the sealing member is arranged therein are formed continuously.

Thus, the width of the connector-side recess portion 53 is equal to the sum of a width corresponding to the widths of two other recess portions and a width corresponding to the width of one connector-side protruding portion 54, and hence the width of the connector-side recess portion 53 is a dimension that is three times as large as the width of the other recess portion. As illustrated in FIG. 1, the recess portions on both sides of the connector-side protruding portion 54 communicate to the connector-side recess portion 53, and hence there is a feature in that continuity is secured when the waterproof sealing material is to be applied.

Further, the sealing surfaces of the housing 51 and the upper case 20 and the sealing surfaces of the housing 51 and the lower case 30 are arranged, in a unified manner, on an outer surface of a partition wall of a connector 50 to which connector terminals are press-fitted. The widths of the protruding portions and the recess portions are limited so that a dimension corresponding to the sum of a press-fitting dimension of each of the connector terminals and a contact dimension of each of the connector terminals with those of a mating connector is minimized and thus the connector terminals do not have a long dimension.

Referring to FIGS. 1 and 3 of an "electronic control apparatus" disclosed in Japanese Patent Application Laid-open No. 2009-123558, sealing materials 130 are applied to an interface between an outer side of a top casing 50 (corresponding to the cover) and an outer edge of a bottom casing 70 (corresponding to the base), which form a casing body of an electronic control apparatus 10, an interface between a housing 111 of a connector 110 mounted on a circuit board 90 and the outer edge of the top casing 50, and to an interface between the housing 111 and the outer edge of the bottom casing 70, respectively, and an inner space of the casing body that houses the circuit board 90 is water-sealed. A top sealing projection 57 formed on the top casing 50 and a top sealing recess 119 formed in the housing 111 mate with each other. Sealing surfaces of the top sealing projection 57 and the top sealing recess 119 are provided on an inner side of a partition wall of the housing 111. A bottom sealing recess 77 formed on the bottom casing 70 and a bottom sealing projection 120a formed in the housing 111 mate with each other. Sealing surfaces of the bottom sealing recess 77 and the bottom sealing projection 120a are provided on an outer side of the partition wall of the housing 111.

As described above, the sealing surfaces of the housing 111 and the top casing 50 and the sealing surfaces of the housing 111 and the bottom casing 70 are separated into an inner surface and an outer surface of the partition wall of the connector 110 to which connector terminals are press-fitted. The widths of the projections and the recesses are limited so that a dimension corresponding to the sum of a press-fitting dimension of each of the connector terminals and a contact dimension of each of the connector terminals with those of a mating connector is minimized and thus the connector terminals do not have a long dimension.

Referring to FIG. 3 of a "board housing case for vehicle-mounted electronic device" disclosed in Japanese Patent Application Laid-open No. 2013-004611, a circuit board 40 is hermetically-sealed and housed in a metal case formed of a metal base 30 and a metal cover 20. A concave thread formed in the cover 20 is fitted onto a convex thread formed on a connector housing 41. Convexoconcave sealing surfaces are provided on an inner side of a partition wall of the connector housing 41. A convex thread formed on the base 30 is fitted into a concave thread formed in the connector housing 41. Convexoconcave sealing surfaces are also provided on the inner side of the partition wall of the connector housing 41. However, the two types of convexoconcave sealing surfaces provided on the connector housing 41 are arranged while being shifted from each other, and hence the connector housing has a long body dimension.

As described above, in each of Japanese Patent Application Laid-open Nos. 2009-070855, 2009-123558, and 2013-004611, it is necessary to provide two types of convexoconcave sealing surfaces in the connector housing, and hence the connector housing has a long body dimension. However, it is necessary to cause the two types of convexoconcave sealing surfaces to communicate to each other with the waterproof sealing material, and in Japanese Patent Application Laid-open Nos. 2009-123558 and 2013-004611, the two types of convexoconcave sealing surfaces are connected to a common accumulation portion for the waterproof sealing material.

In the "electronic device" disclosed in Japanese Patent Application Laid-open No. 2009-070855, the convex-concave-convex sealing surface provided on the housing 51, on which the connector-side recess portion 53 to be fitted onto the second protruding part 25b of the upper case 20 is formed at the center, and the concave-convex-concave sealing surface provided on the housing 51, on which the connector-side protruding portion 54 to be fitted into the second recess part 35b of the lower case 30 is formed at the center, pass by and merge with each other at an intermediate portion of the side surface of the housing 51.

Thus, both of the connector opening portion of the upper case 20 and the connector opening portion of the lower case 30 are raised up to the intermediate position on the side surface of the connector. Therefore, when the lower case 30 is formed by, for example, aluminum die casting and the upper case 20 is formed of, for example, a resin forming material, there is a problem in that the entire weight becomes larger.

Further, in the "electronic control apparatus" disclosed in Japanese Patent Application Laid-open No. 2009-123558, the convex-concave-convex sealing surface provided on the housing 111, on which the top sealing recess 119 to be fitted onto the top sealing projection 57 of the top casing 50 is formed at the center, and the concave-convex-concave sealing surface provided on the housing 111, on which the bottom sealing projection 120a to be fitted into the bottom sealing recess 77 of the bottom casing 70 is formed at the center, are arranged across the partition wall of the housing 111.

Thus, the bottom casing 70 is extended beyond the partition wall of the housing 111. Therefore, when the bottom casing 70 is formed by, for example, aluminum die casting and the top casing 50 is formed of, for example, a resin forming material, there is a problem in that the entire weight becomes larger.

Still further, in the "board housing case for vehicle-mounted electronic device" disclosed in Japanese Patent Application Laid-open No. 2013-004611, the concave-convex-concave sealing surface provided on the connector housing 41, on which the convex thread on the connector housing side to be fitted into the concave thread of the cover 20 is formed at the center, and the convex-concave-convex sealing surface provided on the connector housing 41, on which the concave thread on the connector housing side to be fitted onto the convex thread of the base 30 is formed at the center, pass by and merge with each other at both end positions on the base 30 in a longitudinal direction of the connector housing 41. Therefore, there is a problem in that the connector has a long body.

Still further, the cover 20 and the base 30 are formed by sheet metal working, and the convexoconcave sealing surfaces pressed into an undulating shape are shallow and wide. Therefore, there is a problem in that the connector has an even longer body and the electric resistance of the connector pins is increased, resulting in a factor of heat generation. Note that, even when the cover is formed into a resin forming product and the base is formed by aluminum die casting, there are problems in that it is difficult to manufacture the die for narrow and deep convexoconcave sealing surfaces, that the releasability becomes poor, and that the life of the die becomes shorter. The same problems are also inherent in Japanese Patent Application Laid-open Nos. 2009-070855 and 2009-123558.

SUMMARY OF THE INVENTION

It is a first object of the present invention to solve the above-mentioned problems, and to provide a waterproof control unit capable of simplifying the structure of a die for a cover or a base to be subjected to forming or sheet metal working and suppressing a situation where a connector housing has a long body dimension. It is a second object of the present invention to provide a method of assembling a waterproof control unit, which is suited to a waterproof control unit capable of suppressing a situation where a connector housing has a long body dimension.

According to one embodiment of the present invention, there is provided a waterproof control unit, including:
  a casing including a base and a cover;
  a circuit board hermetically housed in the casing,
    the circuit board including a circuit component and a plurality of external connection contact terminals having mounted thereon,
    the circuit board including a connector housing made of a resin forming material having positioned and fixed thereto;
  a first sealing gap defined between opposing surfaces of the connector housing and the cover;
  a second sealing gap defined between opposing surfaces of the connector housing and the base; and
  a third sealing gap defined between opposing surfaces of the base and the cover,
    the first sealing gap, the second sealing gap, and the third sealing gap each being filled with a waterproof sealing material, and being provided so as to expose, from the casing, an end surface of the connector housing having the plurality of external connection contact terminals passing through the end surface, at least one of the first sealing gap and the second sealing gap including: a narrow-gap space defined by a pair of slope portions formed by the connector housing and one of the cover and the base; a part of a pair of outer-step flat portions communicating to the pair of slope portions; and a part of a pair of inner-step flat portions, the pair of outer-step flat portions being positioned on an outer side of the casing with respect to the pair of inner-step flat portions, the waterproof control unit further including a gap regulating member and a plane movement regulating member provided in one of the gap between the connector housing and the cover, defining the first sealing gap and the gap between the connector housing and the base, defining the second sealing gap, the gap regulating member including a gap-setting protrusion provided on one of the pair of outer-step flat portions, which are formed by the connector housing and the one of the cover and the base, or one of the pair of inner-step flat portions, which are formed by the connector housing and the one of the cover and the base, the gap-setting protrusion being brought into abutment on another of the pair of outer-step flat portions or another of the pair of inner-step flat portions, the plane movement regulating member including at least a pair of opposing members for regulating a relative position of the connector housing so that a horizontal gap dimension between the pair of slope portions, which are formed by the connector housing and the one of the cover and the base, falls within a predetermined range, the pair of opposing members including:

a positioning protrusion formed on one of the connector housing and the cover, or on one of the connector housing and the base; and a positioning fitting hole formed on another of the connector housing and the cover, or on another of the connector housing and the base, the positioning protrusion being loosely fitted into the positioning fitting hole.

As one method of assembling the waterproof control unit according to the one embodiment of the present invention, there is provided a method including:

a first processing step of mounting a base onto a first jig, and applying, into a non-looped shape, a pasty waterproof sealing material to a sealing surface of the base, defining a second sealing gap;

a second processing step of mounting and fixing, onto the base, a circuit board having a circuit component and a connector housing mounted and soldered thereonto in advance, to thereby join the connector housing and the base;

a third processing step of mounting a cover onto a second jig under a reversed state, and applying, into a looped shape, a pasty waterproof sealing material to a sealing surface of the cover, defining a first sealing gap, and a pasty waterproof sealing material to the sealing surface of the cover, defining a third sealing gap;

a fourth processing step of placing the base and the circuit board including the connector housing, which are subjected to the second processing step, onto the cover subjected to the third processing step so that the base and the circuit board are opposed to the cover, to thereby integrate and fix the cover and the base; and a preliminary processing step of applying, for a waterproof control unit including, as the circuit component, one of a first heat generating component mounted on a surface of the circuit board, which is opposed to the cover, and a second heat generating component mounted on a surface of the circuit board, which is opposed to the base, and including, on the base, one of a first heat transfer base portion adjacent to a bottom surface of the first heat generating component and a second heat transfer base portion adjacent to a back surface of the second heat generating component, a pasty heat conductive adhesive to one of a surface of the first heat transfer base portion and a surface of the second heat transfer base portion at a stage prior to the first processing step, the first sealing gap between the cover and the connector housing being defined by a pair of inner-step flat portions, a pair of slope portions, and a pair of outer-step flat portions, the third sealing gap between the cover and the base being a convexoconcave sealing surface having a concave thread mainly on the cover side, or including inner-step flat portions, slope portions, and outer-step flat portions, the method further including drying and curing, after finishing the fourth processing step, the pasty waterproof sealing materials and the pasty heat conductive adhesive by one of standing at room temperature and heating while carrying out visual inspection and performance inspection.

As described above, the waterproof control unit according to the one embodiment of the present invention is a casing for hermetically housing the circuit board by the base, the cover, and the connector housing. At least the waterproof sealing material in the gap between the connector housing and the cover or between the connector housing and the base is filled in the narrow-gap space defined by the pair of slope portions, the pair of outer-step flat portions, and the pair of inner-step flat portions. The narrow-gap space is defined so as to secure predetermined waterproof sealing surfaces by the gap regulating member and the plane movement regulating member.

Thus, there are effects in that the structure of the die for the cover or the base to be subjected to forming or sheet metal working can be simplified, and that the situation where the connector housing has a long body dimension can be suppressed while reducing the load on the die, thereby being capable of reducing the electric resistance of the contact terminals. Further, as compared to the waterproof control unit in which two sets of convexoconcave sealing surfaces for the cover and the base are provided to the connector housing, the entire width of the sealing surfaces is suppressed by forming the cover and the base through use of the slope portions, the outer-step flat portions, and the inner-step flat portions in a unified manner, or by forming the cover and the base through use of one set of convexoconcave sealing surfaces and the slope portions, the outer-step flat portions, and the inner-step flat portions in combination. Thus, there is an effect in that sealing performance as high as that of the waterproof control unit using two sets of convexoconcave sealing surfaces can be obtained.

Note that, also when one set of convexoconcave sealing surfaces and the slope portions, the outer-step flat portions, and the inner-step flat portions are used in combination, the width of the convexoconcave sealing surfaces is increased and the fitting depth is decreased as compared to the case where two sets of convexoconcave sealing surfaces are provided. Thus, there is an effect in that the structure of the die can be simplified. Further, there are effects in that the sealing path can be extended by the slope portions, the outer-step flat portions, and the inner-step flat portions as compared to a horizontal surface, and that the strength of the cover or the base formed of a thin member can be increased, thereby being capable of thinning the cover or the base and forming the cover or the base at low cost.

As described above, in the one method of assembling the waterproof control unit according to the one embodiment of the present invention, after the waterproof sealing material is applied to the second sealing gap surface of the base, the circuit board including the connector housing is integrated and fixed to the base. Subsequently, the waterproof sealing materials are applied to the sealing surfaces of the cover into a looped shape, and then the cover and the base are coupled to each other and all the components are integrated and fixed. After that, the visual inspection and the performance inspection are carried out.

Thus, the joining processing is carried out immediately after the waterproof sealing materials are applied, and hence there is no risk of joining failure due to the drying of the waterproof sealing materials. Accordingly, there is an effect in that the opposing state of the sealing surfaces can be monitored by confirming the fitting state between the positioning fitting hole and the positioning protrusion. Further, the waterproof sealing materials, which are to be applied into a looped shape so as to surround the periphery of the cover in the third processing step, are applied to the concave thread groove surface of the convexoconcave sealing surfaces or the boundary position between the slope portion and the inner-step flat portion. Accordingly, there is an effect in that the work of applying the waterproof sealing materials is facilitated. Note that, there is an effect in that, when the heat generating component is mounted on the circuit board, the heat conductive adhesive can directly be applied to the heat transfer base portion of the base.

BRIEF DESCRIPTION OF THE DRAWINGS

FIG. 7 is a flowchart illustrating assembly of the waterproof control unit according to the first embodiment of the present invention.

FIG. 13 is a flow chart illustrating assembly of the waterproof control unit according to the second embodiment of the present invention.

DETAILED DESCRIPTION OF THE PREFERRED EMBODIMENTS

Figure 1:
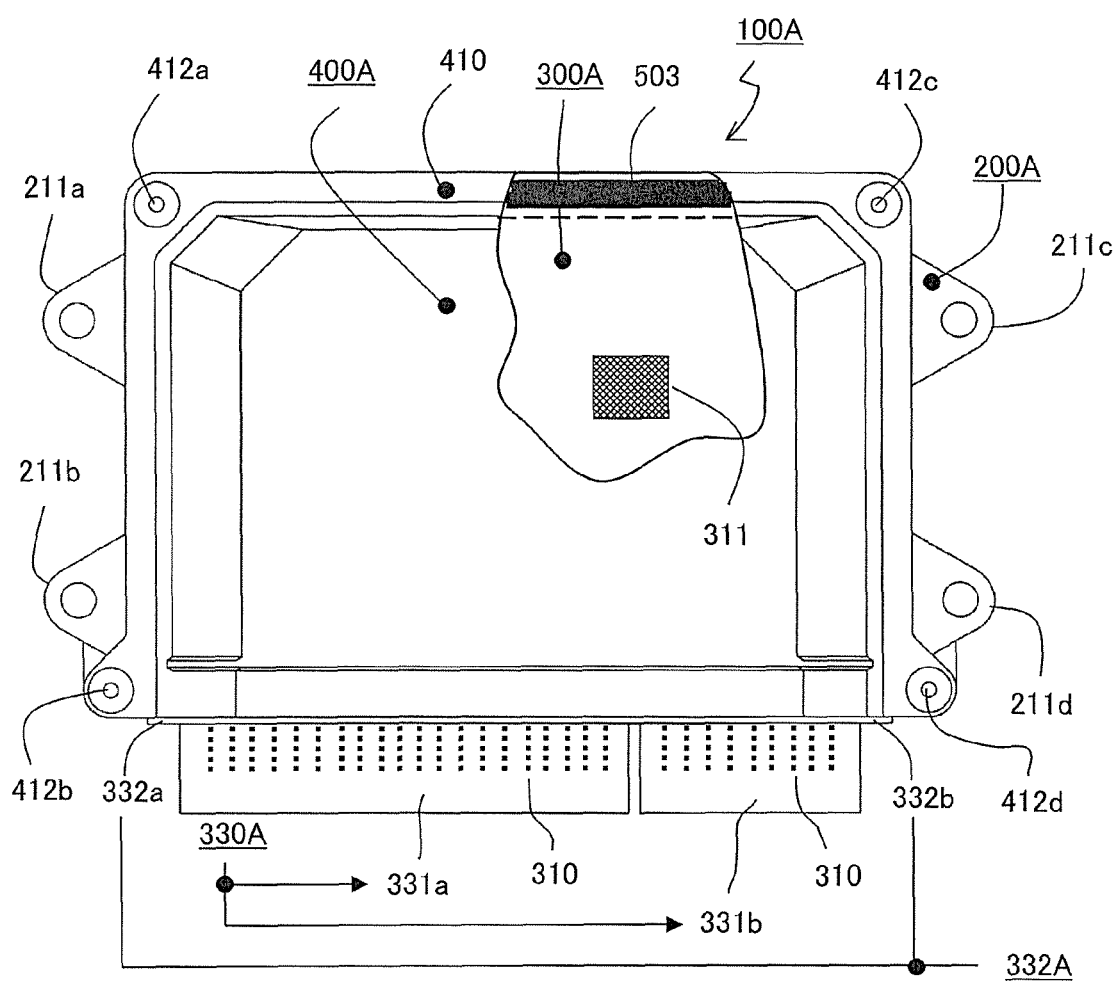
FIG. 1 is a plan view illustrating a waterproof control unit according to a first embodiment of the present invention.

Now, a waterproof control unit and a method of assembling the waterproof control unit according to exemplary embodiments of the present invention are described with reference to the drawings. In the drawings, the same or corresponding parts are represented by the same reference symbols for description.

First Embodiment

Figure 2:
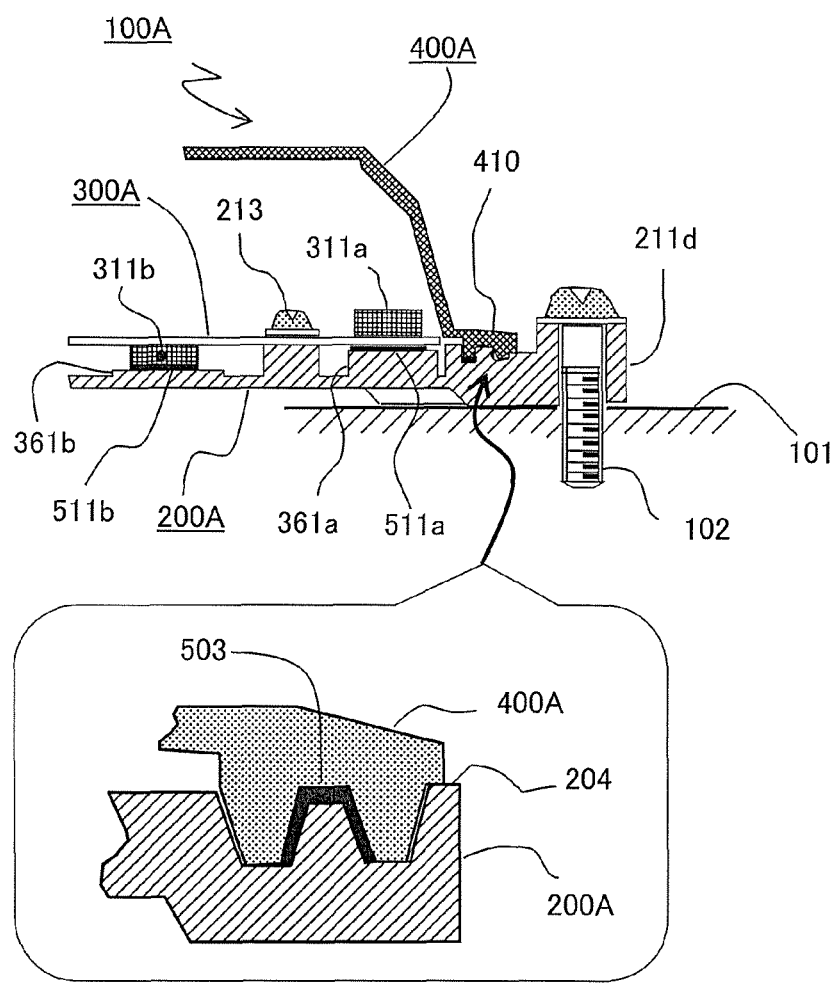
FIG. 2 is a view illustrating a mounting structure of the waterproof control unit of FIG. 1.
Figure 3:
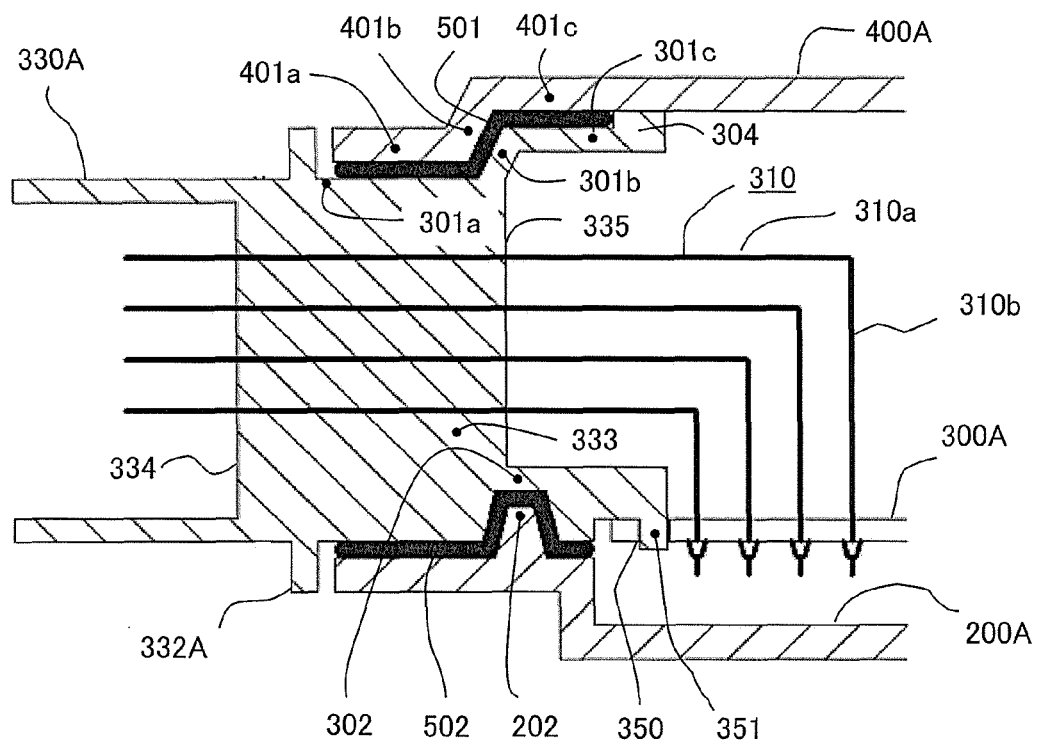
FIG. 3 is a detailed sectional view illustrating a connector housing of the waterproof control unit of FIG. 1.
Figure 4:
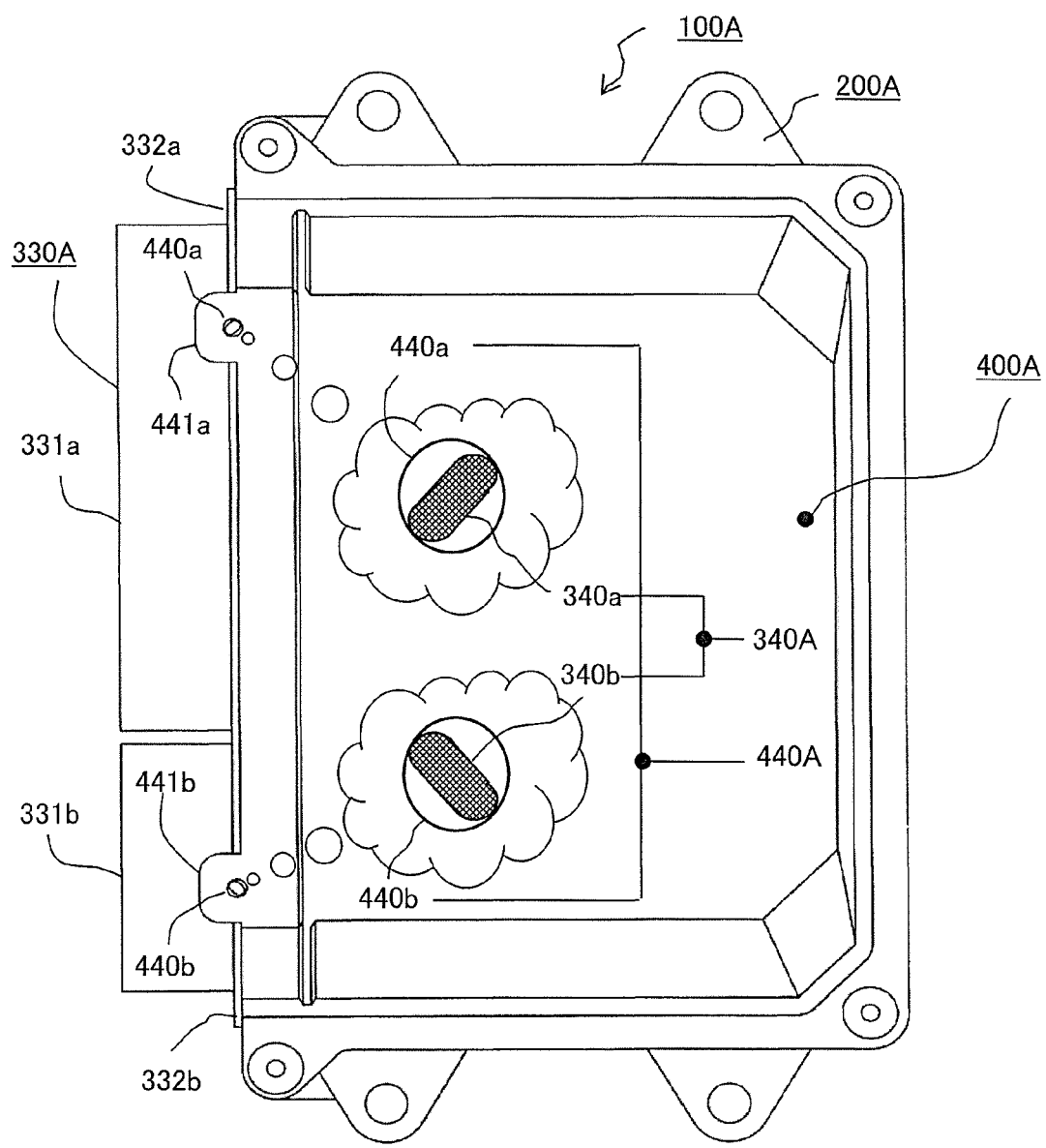
FIG. 4 is a plan view illustrating a cover side of the waterproof control unit of FIG. 1.

Now, descriptions are sequentially made of FIG. 1, which is a plan view illustrating a waterproof control unit according to a first embodiment of the present invention, FIG. 2, which is a view illustrating a mounting structure of the waterproof control unit of FIG. 1, FIG. 3, which is a detailed sectional view illustrating a connector housing of the waterproof control unit of FIG. 1, and FIG. 4, which is a plan view illustrating a cover side of the waterproof control unit of FIG. 1.

In FIG. 1, a waterproof control unit 100A includes a base 200A, a circuit board 300A, and a cover 400A. The base 200A includes four mounting legs 211a to 211d, and is formed by aluminum die casting. A plurality of circuit components 311 and heat generating components 311a and 311b (see FIG. 2) described later are mounted on the circuit board 300A. The cover 400A includes a flange 410 on three outer peripheral wall portions, and is made of resin. The remaining one outer peripheral wall portion of the cover 400A is not provided, and an opening portion closed by a connector housing 330A is formed instead.

The connector housing 330A including first and second connector housings 331a and 331b integrally formed is attached to one side of the circuit board 300A. Looped peripheral walls 332a and 332b described later with reference to FIGS. 3 and 4 are provided in a projecting manner on outer peripheries of the first and second connector housings 331a and 331b, respectively. The looped peripheral walls 332a and 332b are collectively referred to as "looped peripheral wall 332A."

In FIG. 2, mounting screws 102 for mounting and fixing the waterproof control unit 100A to a mounting surface 101 are inserted into unloaded holes of the four mounting legs 211a to 211d provided to the base 200A, and are tightened into screw holes of the mounting surface 101 with a screw fastening tool (not shown).

On joining surfaces extending along respective three sides of outer peripheries of the cover 400A and the base 200A, a plurality of adjacent convex threads and concave threads engage with each other to form convexoconcave sealing surfaces having a waterproof sealing material 503 applied therebetween. The cover 400A and the base 200A are fastened and fixed to each other with fixing screws (not shown) tightened from a back surface of the base 200A through screw holes 412a to 412d of FIG. 1, which are formed at four corners of the cover 400A.

At this time, the cover 400A and the base 200A abut on each other at a gap-setting abutment surface 204, to thereby determine a gap dimension of a third sealing gap to which the waterproof sealing material 503 is to be applied. The circuit board 300A is fastened and fixed, with a plurality of fixing screws 213, to a plurality of fixing base portions provided onto an inner surface of the base 200A. Note that, instead of fastening and fixing the circuit board 300A with the fixing screws 213, the circuit board 300A may be sandwiched between the respective three sides of the outer peripheries of the cover 400A and the base 200A.

The circuit board 300A includes the first heat generating component 311a mounted on a board surface on the cover 400A side, and the second heat generating component 311b mounted on a board surface on the base 200A side. The base 200A includes a first heat transfer base portion 361a adjacent to a bottom surface of the first heat generating component 311a, and a second heat transfer base portion 361b adjacent to a back surface of the second heat generating component 311b. Heat conductive adhesives 511a and 511b are applied to surfaces of the first and second heat transfer base portions 361a and 361b, respectively.

In FIG. 3, the connector housing 330A representing the first and second connector housings 331a and 331b includes the looped peripheral wall 332A (332a and 332b) described above with reference to FIG. 1, and a partition wall 333 to which contact terminals 310 of a right-angle type are press-fitted. A mating connector (not shown) is inserted at a position on an outer side of an outer boundary surface 334 of the partition wall 333, and mating contact terminals are inserted to establish contact connection to ends of the contact terminals 310 on one side.

Horizontal portions 310a and perpendicular portions 310b (perpendicular to the horizontal portions 310a) of the contact terminals 310 are exposed at a position on an inner side of an inner boundary surface 335 of the partition wall 333. Distal ends of the perpendicular portions 310b pass through the front and back surfaces of the circuit board 300A, and are connected on the back surface side by soldering. Note that, when the perpendicular portions 310b of the contact terminals 310 are expanded and contracted due to a change in ambient temperature, the horizontal portions 310a are curved so as to prevent breakage of the solder-connection portion between the perpendicular portions 310b and the circuit board 300A. When the horizontal portions 310a of the contact terminals 310 are expanded and contracted due to a change in ambient temperature, the perpendicular portions 310b are curved so as to prevent stress from being applied to the press-fitting portion between the horizontal portions 310a and the partition wall 333.

Further, on both sides of a left side of the circuit board 300A, a board hole 350 is provided, to which a positioning protrusion piece 351 such as a snap pin press-fitted to the connector housing 330A is fitted so as to regulate a relative mounting position between the connector housing 330A and the circuit board 300A.

At a left opening portion of the cover 400A where a part of the connector housing 330A is exposed, an outer-step flat portion 401a, a slope portion 401b, and an inner-step flat portion 401c are provided and opposed to an outer-step flat portion 301a, a slope portion 301b, and an inner-step flat portion 301c on the connector housing 330A side, respectively, to thereby define a first sealing gap. In the first sealing gap, a waterproof sealing material 501 is applied. Note that, the waterproof sealing material 501 is applied in a range beyond the inner boundary surface 335 of the partition wall 333.

Further, at an inner end surface position of the inner-step flat portion 301c of the connector housing 330A, a plurality of gap-setting protrusions 304 are provided in a projecting manner, and abut on an inner surface of the cover 400A, to thereby restrict such a situation where the first sealing gap becomes extremely small. The gap-setting protrusions 304 may be provided onto the inner surface side of the cover 400A, or may be provided onto the outer-step flat portion 301a of the connector housing 330A or the outer-step flat portion 401a of the cover 400A. Further, the gap-setting protrusions 304 may overlap with a boundary position of the waterproof sealing material 501 so that a part of the gap-setting protrusions 304 is included in the region where the waterproof sealing material 501 is applied.

A second concave thread 302 for defining a second sealing gap together with the base 200A is provided in a bottom surface of the connector housing 330A, and a second convex thread 202 loosely fitted into the second concave thread 302 is provided onto a left side of the base 200A. In the second sealing gap defined by the second concave thread 302 and the second convex thread 202, a waterproof sealing material 502 is applied. Note that, in the second sealing gap, gap-setting protrusions (not shown) are provided between the connector housing 330A and the base 200A.

Note that, the second sealing gap may be regulated by a height of a mounting surface of the circuit board 300A and the base 200A. In this case, the gap-setting protrusions for the second sealing gap may be omitted. In the first sealing gap, the respective portions are dimensioned so that the gap dimension between the outer-step flat portions becomes smaller than the gap dimension between the inner-step flat portions. With this consideration, when the waterproof sealing material 501 is applied, the waterproof sealing material 501 is hard to flow out but easy to flow in.

In FIG. 4, on the looped peripheral wall 332A (332a and 332b) of the connector housing 330A, a cutout portion is provided, in which a positioning protrusion 340A (340a and 340b) is provided in a projecting manner. Protrusion pieces 441a and 441b each having a positioning fitting hole 440A (440a and 440b) are provided onto the cover 400A. The protrusion pieces 441a and 441b are fitted into the cutout portions of the looped peripheral walls 332a and 332b, respectively, and the positioning protrusion 340A (340a and 340b) is fitted into the positioning fitting hole 440A (440a and 440b).

Note that, the positioning fitting hole 440A (440a and 440b) is a circular hole, whereas the positioning protrusion 340A (340a and 340b) has an oblong shape in cross section and is inclined into an inverted V-shape in which an intersection between major axes of the pair of positioning protrusions is positioned on an outer side of an end surface of the connector housing 330A. Further, the depths of the cutout portions of the looped peripheral walls 332a and 332b may be adjusted and the protrusion pieces 441a and 441b of the cover 400A may be brought into abutment on the cutout portions, respectively. This structure may serve also as a part of the gap-setting protrusions 304 between the connector housing 330A and the cover 400A.

Figure 5A:
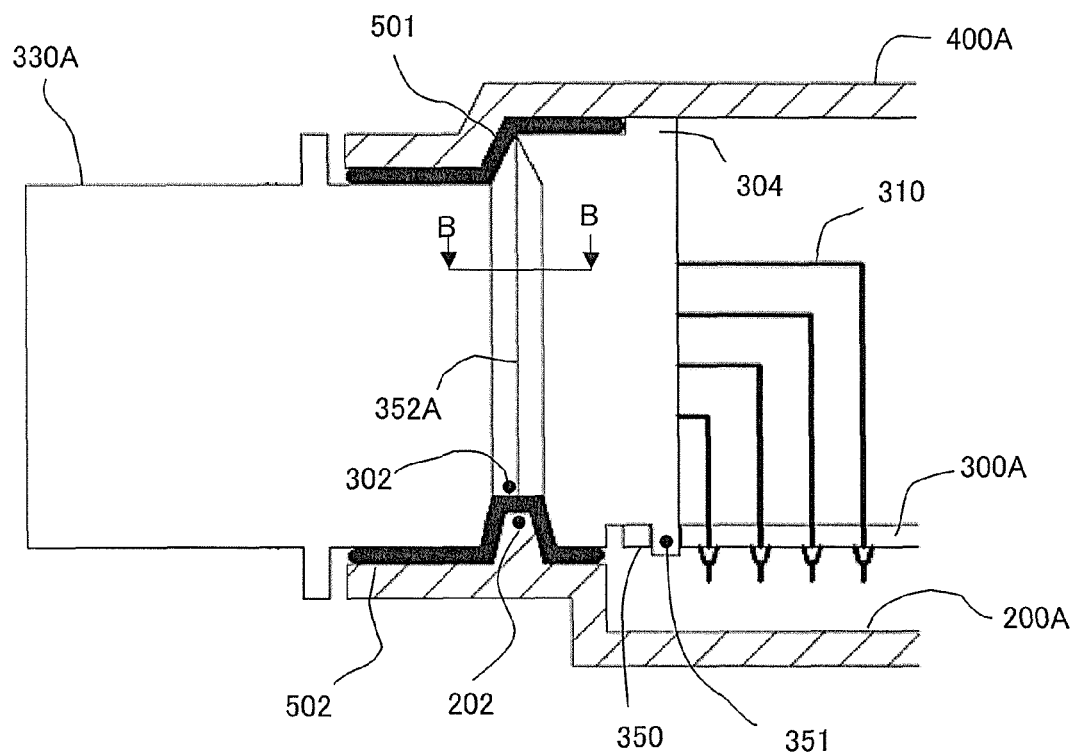
FIGS. 5A and 5B are detailed side views illustrating a connector housing as a modification of the connector housing of FIG. 3.
Figure 5B:
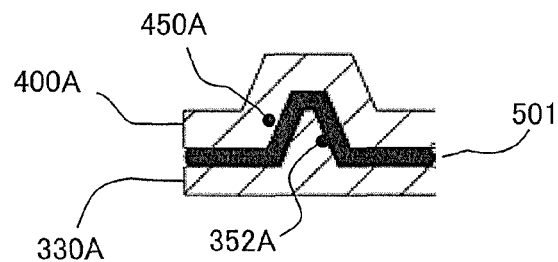

Next, descriptions are made of FIGS. 5A and 5B, which are detailed side views illustrating a connector housing as a modification of the connector housing of FIG. 3. Note that, FIG. 5A is a side view illustrating a connector housing 330A as a modification, and FIG. 5B is a local sectional view taken along the line B-B of FIG. 5A.

In FIGS. 5A and 5B, an exposed end surface of the connector housing 330A has a trapezoidal shape. On the right and left slopes of the trapezoid of the connector housing 330A, there are formed a pair of right and left (front and back sides of the drawing sheet of FIG. 5A) convexoconcave engagement surfaces including a pair of right and left side-surface convex threads 352A, which are provided in a projecting manner on the connector housing 330A, and fitting concave threads 450A of the cover 400A, which are loosely fitted onto the side-surface convex threads, respectively. The side-surface convex threads 352A and the fitting concave threads 450A serve as auxiliary opposing members, which are added to a plane movement regulating member including the pair of opposing members that are the positioning protrusion 340A and the positioning fitting hole 440A illustrated in FIG. 4.

Thus, the convexoconcave engagement surfaces provided onto the side surfaces of the connector housing 330A serve also as an auxiliary plane movement regulating member. The gap dimension between the slopes of the connector housing 330A and the cover 400A can also be regulated by loose-fitting dimensions between the respective convexoconcave sealing surfaces.

Note that, even when the loose-fitting dimensions between the side-surface convex threads 352A and the fitting concave threads 450A are reduced and the side-surface convex threads 352A and the fitting concave threads 450A in this state serve as a main plane movement regulating member, the presence and absence of abnormality of the relative positional relationship among the cover 400A, the connector housing 330A, and the base 200A can be determined by visually confirming the fitting state between the positioning protrusion 340A and the positioning fitting hole 440A.

In the above description, the base 200A is formed by aluminum die casting, and the cover 400A and the connector housing 330A are made of resin. Alternatively, the cover 400A may be formed by sheet metal working, and the third sealing gap between the cover 400A and the base 200A may be defined by employing a convexoconcave sealing surface system using undulating deformation portions to be described later with reference to FIG. 9, or by employing a step-slope system to be described later with reference to FIG. 12. Further, the second sealing gap between the connector housing 330A and the base 200A may be defined by employing the convexoconcave sealing surface system using the undulating deformation portions, or by employing the step-slope system.

Figure 6A:
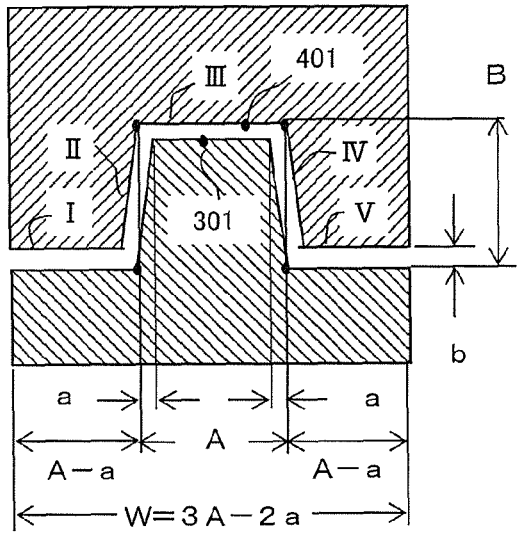
FIGS. 6A to 6C are explanatory sectional views illustrating seals of the waterproof control unit of FIG. 1.
Figure 6C:
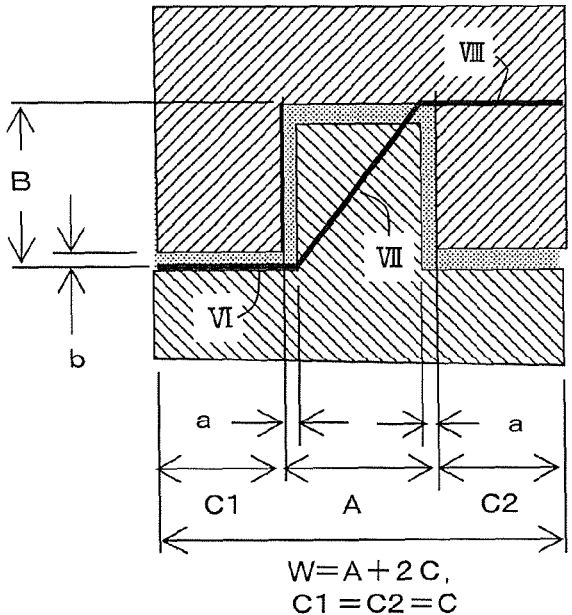
Figure 6B:
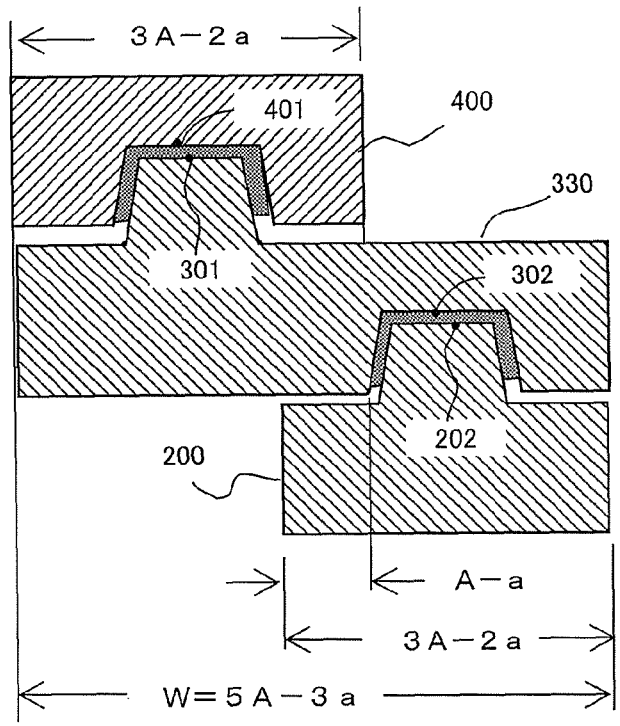

Next, referring to FIGS. 6A to 6C, detailed description is made of a difference between the step-slope system and the convexoconcave sealing surface system in the waterproof control unit 100A constructed as illustrated in FIGS. 1 to 5B. In FIG. 6A illustrating cross sections of convexoconcave sealing surfaces having a convex thread of a trapezoidal tooth loosely fitted into a concave thread of a trapezoidal tooth, a dimension "A" is a dimension of a bottom portion of each of a concave thread 401 and a convex thread 301, and a dimension "a" is a deviation dimension of a tooth width between the bottom portion and the top portion of the respective trapezoidal teeth. Further, a dimension "b" is a gap dimension between the bottom portion and the top portion of the respective trapezoidal teeth, and a dimension "B" is a distance dimension between the bottom portions of the respective trapezoidal teeth. In this case, a sealing path L0 of the convexoconcave sealing surfaces of the trapezoidal teeth is determined by adding dimensions "I", "II", "III", "IV", and "V" of FIG. 6A, provided that I=V=A−a and III=A. Further, II=IV= $\sqrt{[(B-b)^2+a^2]}$.

When it is assumed that A=3 mm, B=2 mm, α=a/A, β=b/B, and α=β=0.1 as Calculation Example 1, I=V=3−0.3=2.7 mm, III=3 mm, and II=IV=$\sqrt{[(2-0.2)^2+0.3^2]}$=1.82 mm. Thus, the sealing path L0 is expressed as L0=(I+V)+(II+IV)+III=5.4+ 3.64+3=12.04 mm. On the other hand, a lateral width dimension "W" of the sealing surfaces is expressed as W=3A− 2a=8.4 mm. Thus, with the convexoconcave sealing surfaces, the sealing path is extended by 12.04−8.4=3.64 mm.

In FIG. 6B illustrating a cross section in a case where two types of convexoconcave sealing surfaces are provided in a connector housing, a connector housing 330 includes a first convex thread 301 loosely fitted into a first concave thread 401 provided onto a cover 400, and a second concave thread 302 loosely fitted onto a second convex thread 202 provided onto a base 200. First convexoconcave sealing surfaces of the first concave thread 401 and the first convex thread 301 and second convexoconcave sealing surfaces of the second convex thread 202 and the second concave thread 302 are arranged with a shift corresponding to one tooth. As a result, a necessary sealing width "W" is expressed as W=5A−3a. When it is assumed similarly to Calculation Example 1 that A=3 mm, B=2 mm, α=a/A, β=b/B, and α=β=0.1 as Calculation Example 2, W=14.1 mm.

In FIG. 6C illustrating cross sections of sealing surfaces employing the step-slope system, (dimension VI)=(width dimension of sealing gap at outer-step flat portion)=(dimension VIII)=(width dimension of sealing gap at inner-step flat portion)=C+a (provided that C1=C2=C). Further, (dimension VII)=(length of sealing surfaces at slope portion)=$\sqrt{[(A-2a)^2+B^2]}$. Thus, (sealing path dimension Lx)=VI+VII+VIII=2(C+a)+$\sqrt{[(A-2a)^2+B^2]}$.

When it is assumed similarly to Calculation Examples 1 and 2 that A=3 mm, B=2 mm, α=a/A, β=b/B, and α=β=0.1 as Calculation Example 3, the slope dimension VII is 3.12 mm. In order to set the sealing path dimension Lx to a value equal to the sealing path dimension L0 of 12.04 mm in Calculation Example 1, it is assumed through calculation that C=4.16 mm and (dimension ratio γ)=(C−A)/A=0.38. A sealing width dimension in this case is expressed as W=A+2C=11.32 mm, which is a value smaller than the sealing width dimension of 14.1 mm in Calculation Example 2 by 2.78 mm substantially corresponding to one tooth.

Next, description is made of FIG. 7, which is a flow chart illustrating assembly of the waterproof control unit according to the first embodiment of the present invention. In FIG. 7, Step 700 is a start step for work of assembling the waterproof control unit 100A. Prior to the start step 700, preparation steps 701a, 703a, and 703b are carried out.

The preparation step 701a is a step of bonding and fixing in advance a ventilation filter (not shown) to an inner bottom surface of the base 200A with an adhesive. The preparation step 703a is a step of press-fitting and fixing the large number of contact terminals 310 to the partition wall 333 of the connector housing 330A, and press-fitting the positioning protrusion piece 351 such as a snap pin to the connector housing 330A and fitting and fixing the positioning protrusion piece 351 to the board hole 350 of the circuit board 300A. The preparation step 703b is a step of mounting and soldering the heat generating components 311a and 311b and the larger number of circuit components 311 onto the circuit board 300A, and soldering the ends of the contact terminals 310 on one side onto lands provided to the circuit board 300A, to thereby finish an "intermediate assembly body of the circuit board."

Step 701b subsequent to the start step 700 is a preliminary processing step of mounting, onto a first jig, the base 200A having the ventilation filter bonded and fixed thereto in the preparation step 701a, and applying the heat conductive adhesives 511a and 511b to the first and second heat transfer base portions 361a and 361b of the base 200A, respectively.

Step 702 subsequent to Step 701b is a first processing step of applying the waterproof sealing material 502 to the second sealing gap surface of the base 200A. Step 703c subsequent to Step 702 is a second processing step of mounting, onto the base 200A, the "intermediate assembly body of the circuit board" that is finished in the preparation step 703b, and joining, to the mating surfaces, the heat conductive adhesives 511a and 511b applied in Step 701b and the waterproof sealing material 502 applied in Step 702.

Step 704 subsequent to Step 703c is a third processing step of mounting the cover 400A onto a second jig under a reversed state, and applying the waterproof sealing materials 501 and 503 to the first sealing gap surface and the third sealing gap surface into a looped shape, respectively. Step 705 subsequent to Step 704 is a fourth processing step of placing the assembly body of the base 200A and the circuit board 300A including the connector housing 330A, which are assembled in Step 703c, onto the back surface of the cover 400A, and integrating and fixing the cover 400A and the base 200A with screws or caulking members.

Step 706 subsequent to Step 705 is a step of transferring, to the first jig, the cover 400A and the base 200A integrated in Step 705, checking the dimensions so as to confirm whether or not the first jig interferes with the cover 400A and the base 200A, and carrying out initial setting, performance inspection, and visual inspection of the waterproof control unit 100A while drying, at room temperature or under a heated condition, the heat conductive adhesives 511a and 511b applied in Step 701b, the waterproof sealing material 502 applied in Step 702, and the waterproof sealing materials 501 and 503 applied in Step 704. Thus, the processing proceeds to a general assembly completion step 707.

Note that, as the visual inspection, it is determined whether or not the cover 400A, the connector housing 330A, and the base 200A have a proper relative positional relationship by inspecting the fitting state between the positioning fitting hole 440A formed in the cover 400A and the positioning protrusion 340A formed on the connector housing 330A, and by carrying out visual determination or automatic determination using image recognition through comparison with a standard sample. Further, the transfer operation between the respective steps, the processing of applying the heat conductive adhesives and the waterproof sealing materials, the screw fastening processing, and the like are all carried out automatically, and the heat conductive adhesives and the waterproof sealing materials are controlled to be applied in appropriate amounts so as to prevent any excess and deficiency.

As is apparent from the above-mentioned description, the waterproof control unit 100A according to the first embodiment of the present invention includes the casing including the base 200A and the cover 400A, and the circuit board 300A hermetically housed in the casing, onto which the circuit component 311 and the plurality of external connection contact terminals 310 are mounted, and the connector housing 330A made of the resin forming material is positioned and fixed, in which, in order to expose, from the casing, the end surface of the connector housing 330A having the plurality of external connection contact terminals 310 passing therethrough, the waterproof sealing materials 501, 502, and 503 filled into the first sealing gap defined between opposing surfaces of the connector housing 330A and the cover 400A, the second sealing gap defined between opposing surfaces of the connector housing 330A and the base 200A, and the third sealing gap defined between opposing surfaces of the base 200A and the cover 400A, respectively, are provided, and in which the first sealing gap includes a narrow-gap space defined by the pair of slope portions 301b and 401b formed by the connector housing 330A and the cover 400A, a part of the pair of outer-step flat portions 301a and 401a communicating to the pair of the slope portions 301b and 401b, and a part of the pair of inner-step flat portions 301c and 401c, the pair of outer-step flat portions 301a and 401a being positioned on an outer side of the casing with respect to the pair of inner-step flat portions 301c and 401c.

Further, the waterproof control unit 100A includes the gap regulating member and the plane movement regulating member provided between the connector housing 330A and the cover 400A, defining the first sealing gap. The gap regulating member is provided to the outer-step flat portions 301a and 401a, or the inner-step flat portions 301c and 401c of the connector housing 330A and the cover 400A, and is a gap-setting protrusion 304 being brought into abutment on another side. The plane movement regulating member includes at least the pair of opposing members for regulating the relative position of the connector housing 330A so that the horizontal gap dimension between the pair of slope portions 301b and 401b of the connector housing 330A and the cover 400A falls within a predetermined range. The pair of opposing members include the positioning protrusion 340A formed on the connector housing 330A or the cover 400A, and the positioning fitting hole 440A formed on another side, the positioning protrusion 340A being loosely fitted into the positioning fitting hole 440A.

The positioning protrusion 340A serving as the plane movement regulating member is formed on the outer-step flat portion 301a of the connector housing 330A, and the positioning fitting hole 440A serving as the plane movement regulating member is formed in the outer-step flat portion 401a of the cover 400A.

As described above, according to claim 2 of the present invention, the gap-setting protrusion serving as the gap regulating member is provided onto the inner or outer side of the sealing portion. The positioning protrusion and the positioning fitting hole serving as the plane movement regulating member are arranged on the outer side of the sealing portion, and the positioning protrusion is provided in a projecting manner on the connector housing side. Thus, the present invention has features in that the fitting state between the positioning protrusion and the positioning fitting hole can visually be confirmed at the stage of assembling the casing, and that, in practical use, the water does not enter the casing through the positioning fitting hole.

The connector housing 330A includes the partition wall 333, to which the plurality of contact terminals 310 of the right-angle type are press-fitted and held, in which the end surface of the connector housing has a trapezoid shape, in which a long base of the trapezoid is positioned by the positioning protrusion piece 351 and the board hole 350, and is fixed to one side of the circuit board 300A. The portion of the connector housing projecting beyond the one side of the circuit board 300A is opposed to the base 200A via the second sealing gap, and is opposed to an opening portion of a side surface of the cover 400A via the first sealing gap, relative to a short top of the trapezoid, or relative to the short top of the trapezoid and right and left slopes of the trapezoid. Among the one of the pair of outer-step flat portions 301a and 401a, the one of the pair of slope portions 301b and 401b, and the one of the pair of inner-step flat portions 301c and 401c, defining the first sealing gap, at least a part of the pair of inner-step flat portions 301c and 401c enters an inner side of the casing beyond the inner boundary surface 335 of the partition wall 333.

As described above, according to claim 3 of the present invention, among the outer-step flat portions, the slope portions, and the inner-step flat portions, defining the first sealing gap between the connector housing and the cover, at least the part of the inner-step flat portions is extended toward the inner side of the partition wall provided onto the connector housing. Thus, the present invention has a feature in that it is possible to enhance the water resistance by extending the sealing path through extension of the first sealing gap utilizing a free space around the exposed contact terminals, or to suppress, when assuming sealing paths of an equal length, a situation where the connector housing has a long body dimension.

The positioning protrusions 340A and the positioning fitting holes 440A are formed at least at two positions on the outer-step flat portions 301a and 401a, which are formed by the connector housing 330A and the cover 400A. The positioning fitting holes 440A each are a circular hole, whereas the positioning protrusions 340A each have an oblong shape in cross section, and are inclined into an inverted V-shape, in which an intersection between major axes of the pair of the positioning protrusions 340A is positioned on an outer side of the end surface of the connector housing 330A.

As described above, according to claim 4 of the present invention, the connector housing and the cover have the plurality of positioning fitting holes and the positioning protrusions fitted into the positioning fitting holes and having the oblong shapes, respectively. The major axes of the respective oblong shapes are inclined into the inverted V-shape. Thus, when the mating connector is shaken from side to side so as to insert and remove the mating connector to and from the larger number of connector pins inside the connector housing, a shaking force applied to the connector housing is released to the cover or the base. Accordingly, the present invention has a feature in that the sealing surfaces can be prevented from peeling off. Further, when the positioning protrusions are formed into a shape of round pins so as to have substantially equal diameters to those of the respective positioning fitting holes, the round pins cannot be fitted into the respective circular holes due to a dimension error between the respective portions. When the positioning protrusions are formed into the oblong shapes, however, distal end portions of the oblong shapes are trimmed so that the positioning protrusions can be fitted without an excessive force, resulting in fitting without looseness. Thus, the present invention has a feature in that the shaking force can reliably be released to the cover or the base.

The looped peripheral wall 332A is provided upright at a boundary position between an exposed portion and a non-exposed portion of the connector housing 330A.

As described above, according to claim 5 of the present invention, the looped peripheral wall is provided at the intermediate portion of the connector housing. Thus, the present invention has a feature in that the waterproof sealing material is prevented from flowing out through the sealing gap defined by the pair of outer-step flat portions at the stage of the assembly process.

An outer-step narrow-gap distance between the pair of outer-step flat portions 301a and 401a is smaller in value than an inner-step narrow-gap distance between the pair of inner-step flat portions 301c and 401c.

As described above, according to claim 6 of the present invention, the outer-step narrow-gap distance between the outer-step flat portions positioned on the outer side of the sealing portion is smaller in value than the inner-step narrow-gap distance between the inner-step flat portions positioned on the inner side of the sealing portion. Thus, the waterproof sealing material applied between the sealing surfaces is easy to flow into the gap between the sealing surfaces without flowing out of the gap between the sealing surfaces. Accordingly, the present invention has a feature in that the narrow-gap space can reliably be filled through control of an appropriate amount of application of the waterproof sealing material.

The exposed end surface of the connector housing 330A has a trapezoid shape, in which one side surface of the cover 400A has an opening portion formed into a trapezoid shape having an upper top, in which a long base of the trapezoid of the connector housing 330A is positioned by the positioning protrusion piece 351 and the board hole 350, and is fixed to one side of the circuit board 300A, and a portion of the connector housing projecting beyond the one side of the circuit board 300A is opposed to the base 200A via the second sealing gap, in which a short top of the trapezoid of the connector housing 330A is opposed to an upper top of the one side surface opening of the cover 400A via the first sealing gap, and in which each of a right slope and a left slope of the trapezoid of the connector housing 330A includes, similarly to the first sealing gap, a narrow-gap space defined by the pair of slope portions 301b and 401b formed by the connector housing 330A and the cover 400A, a part of the pair of outer-step flat portions 301a and 401a communicating to the pair of slope portions, and a part of the pair of inner-step flat portions 301c and 401c, the pair of outer-step flat portions 301a and 401a being positioned on an outer side of the casing with respect to the pair of inner-step flat portions 301c and 401c.

As described above, according to claim 7 of the present invention, the exposed end surface of the connector housing and the opening portion of the side surface of the cover have the shapes of the trapezoids, and the short tops, the right slopes, and the left slopes of the opposing trapezoids of the connector housing and the cover define the first sealing gap. Thus, the present invention has features in that the waterproof sealing material can smoothly be applied so as to flow from the slope portions to the upper tops of the trapezoids, and that a cover made of a sheet metal material or a cover made of a resin forming material with a simple die can be used.

The exposed end surface of the connector housing 330A has a trapezoid shape, in which one side surface of the cover 400A has an opening portion formed into a trapezoid shape having an upper top, in which a long base of the trapezoid of the connector housing 330A is positioned by the positioning protrusion piece 351 and the board hole 350, and is fixed to one side of the circuit board 300A, and a portion of the connector housing projecting beyond the one side of the circuit board 300A is opposed to the base 200A via the second sealing gap, in which a short top, a right slope, and a left slope of the trapezoid of the connector housing 330A are opposed to an upper top portion, a right slope portion, and a left slope portion of the one side surface opening of the cover 400A via the first sealing gap, respectively, and in which each of the right slopes and the left slopes of the trapezoid of the connector housing 330A includes a convexoconcave engagement surface, the convexoconcave engagement surface including: the side-surface convex thread 352A, which is provided in a projecting manner on the connector housing 330A; and the fitting concave thread 450A of the cover 400A, which is loosely fitted onto the side-surface convex thread 352A, the side-surface convex thread 352A and the fitting concave thread 450A serving as auxiliary opposing members added to the plane movement regulating member.

As described above, according to claim 8 of the present invention, the exposed end surface of the connector housing and the opening portion of the side surface of the cover have the shapes of the trapezoids, and the right slopes and the left slopes of the opposing trapezoids of the connector housing and the cover are loosely fitted and engaged with each other by the respective convexoconcave engagement surfaces. Thus, the convexoconcave engagement surfaces serve also as the auxiliary plane movement regulating member. Accordingly, the present invention has a feature in that the gap dimension between the slopes of the connector housing and the cover can also be regulated by the loose-fitting dimensions between the respective convexoconcave sealing surfaces.

The cover 400A is manufactured by molding a resin material with a die, and the base 200A is manufactured by molding an aluminum material with a die. The narrow-gap space defined by the pair of slope portions 301b and 401b, the part of the pair of outer-step flat portions 301a and 401a communicating to the pair of slope portions, and the part of the pair of inner-step flat portions 301c and 401c is provided as the first sealing gap. The gap-setting protrusion 304 serving as the gap regulating member and the plane movement regulating members 340A and 440A are provided at the gap between the connector housing 300A and the cover 400A, defining the first sealing gap. The second sealing gap and the third sealing gap each have a convexoconcave shape in cross sections of the sealing surfaces, and each include a narrow-gap space defined by meshing and fitting to each other. The narrow-gap space of each of the second sealing gap and the third sealing gap has the gap-setting abutment surface 204 serving as a gap regulating member for securing a predetermined gap dimension when the cover 400A and the base 200A are fastened and fixed to each other. A horizontal gap dimension between the pair of slope portions 301b and 401b in the first sealing gap is equal to or larger than a loose-fitting dimension between the convexoconcave sealing surfaces in the each of the second sealing gap and the third sealing gap. When the cover 400A is shifted to one side, before the pair of slope portions 301b and 401b abut on each other, a side surface of a convex surface and a side surface of a concave surface of the convexoconcave sealing surfaces abut on each other so as to regulate an excessively small horizontal gap from being defined between the pair of slope portions 301b and 401b. When the cover 400A is shifted to another side, another side surface of the convex surface and another side surface of the concave surface of the convexoconcave sealing surfaces abut on each other so as to regulate an excessively large horizontal gap from being defined between the pair of slope portions 301b and 401b.

As described above, according claim 9 of the present invention, the first sealing gap is defined by employing the step-slope system, and the second and third sealing gaps are defined by employing the convexoconcave sealing surface system. The gap dimensions of the first to third sealing gaps are determined by the gap regulating members provided in the respective narrow-gap spaces, and the relative positional relationship between the connector housing and the cover is determined by the plane movement regulating member provided in the gap between the connector housing and the cover. Thus, the present invention has features in that the relative positional relationships between the connector housing and the base and between the cover and the base can be regulated by the loose-fitting dimensions between the respective convexoconcave sealing surfaces, that, in the gap between the connector housing and the cover, which are liable to cause the assembly dimension error, the assembly dimension error can be absorbed by a fluctuation error in horizontal gap dimension between the slope portions, and that the fitting state between the positioning protrusion and the positioning fitting hole can visually be confirmed so as to determine whether or not the fluctuation error falls within a proper range.

As is apparent from the above-mentioned description, the method of assembling the waterproof control unit described in the first embodiment includes: the first processing step 702 of mounting the base 200A onto the first jig, and applying, into the non-looped shape, the pasty waterproof sealing material 502 to the sealing surface of the base 200A, defining the second sealing gap; the second processing step 703c of mounting and fixing, onto the base 200A, the circuit board 300A having the circuit component 311 and the connector housing 330A mounted and soldered thereonto in advance, to thereby join the connector housing 330A and the base 200A; the third processing step 704 of mounting the cover 400A onto the second jig under a reversed state, and applying, into a looped shape, the pasty waterproof sealing material 501 to the sealing surface of the cover 400A, defining the first sealing gap, and the pasty waterproof sealing material 503 to the sealing surface of the cover 400A, defining the third sealing gap; and the fourth processing step 705 of placing the base 200A and the circuit board 300A including the connector housing 330A, which are subjected to the second processing step 703c, onto the cover 400A subjected to the third processing step 704 so that the base 200A and the circuit board 300A are opposed to the cover 400A, to thereby integrate and fix the cover 400A and the base 200A.

Further, the method further includes the preliminary processing step 701b of applying, for a waterproof control unit including, as the circuit component 311, the first heat generating component 311a mounted on the surface of the circuit board 300A, which is opposed to the cover 400A, or the second heat generating component 311b mounted on the surface of the circuit board 300A, which is opposed to the base 200A, and including, on the base 200A, the first heat transfer base portion 361a adjacent to the bottom surface of the first heat generating component 311a or the second heat transfer base portion 361b adjacent to the back surface of the second heat generating component 311b, the pasty heat conductive adhesive 511a or 511b to the surface of the first heat transfer base portion 361a or the surface of the second heat transfer base portion 361b at the stage prior to the first processing step 702. The first sealing gap between the cover 400A and the connector housing 330A is defined by the pair of inner-step flat portions 401c and 301c, the pair of slope portions 401b and 301b, and the pair of outer-step flat portions 401a and 301a. The third sealing gap between the cover 400A and the base 200A is a convexoconcave sealing surface having a concave thread mainly on the cover 400A side, or includes inner-step flat portions, slope portions, and outer-step flat portions. The method further includes drying and curing, after finishing the fourth processing step 705, the pasty waterproof sealing materials 501, 502, and 503 and the pasty heat conductive adhesive 511a or 511b by standing at room temperature or heating while carrying out visual inspection and performance inspection.

Second Embodiment

Figure 8:
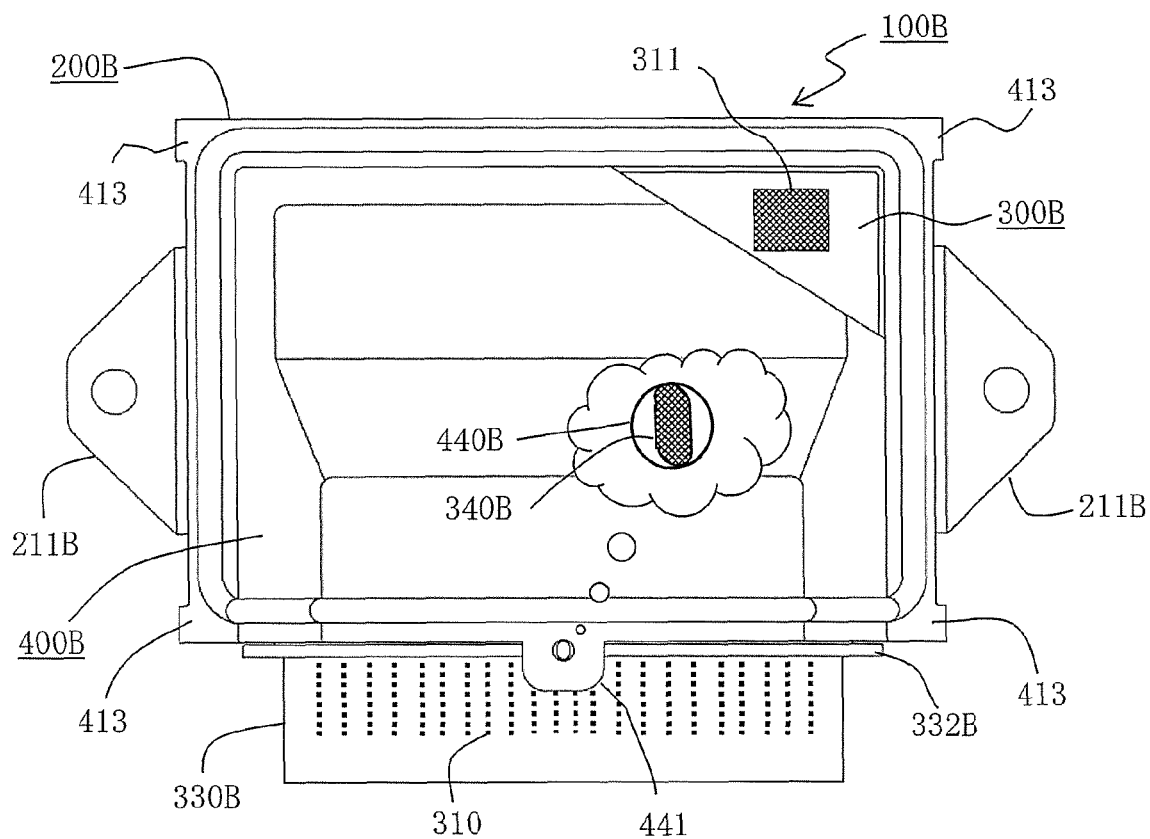
FIG. 8 is a plan view illustrating a waterproof control unit according to a second embodiment of the present invention.
Figure 9:
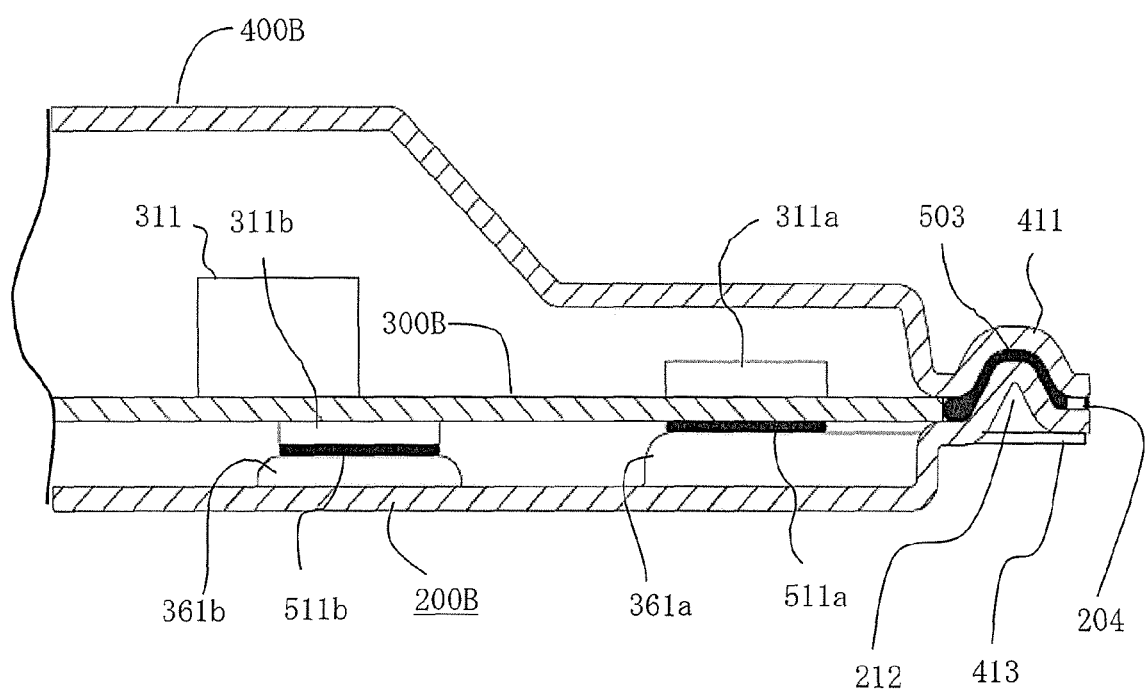
FIG. 9 is a partially detailed sectional view illustrating mounting of a circuit board of the waterproof control unit of FIG. 8.
Figure 10:
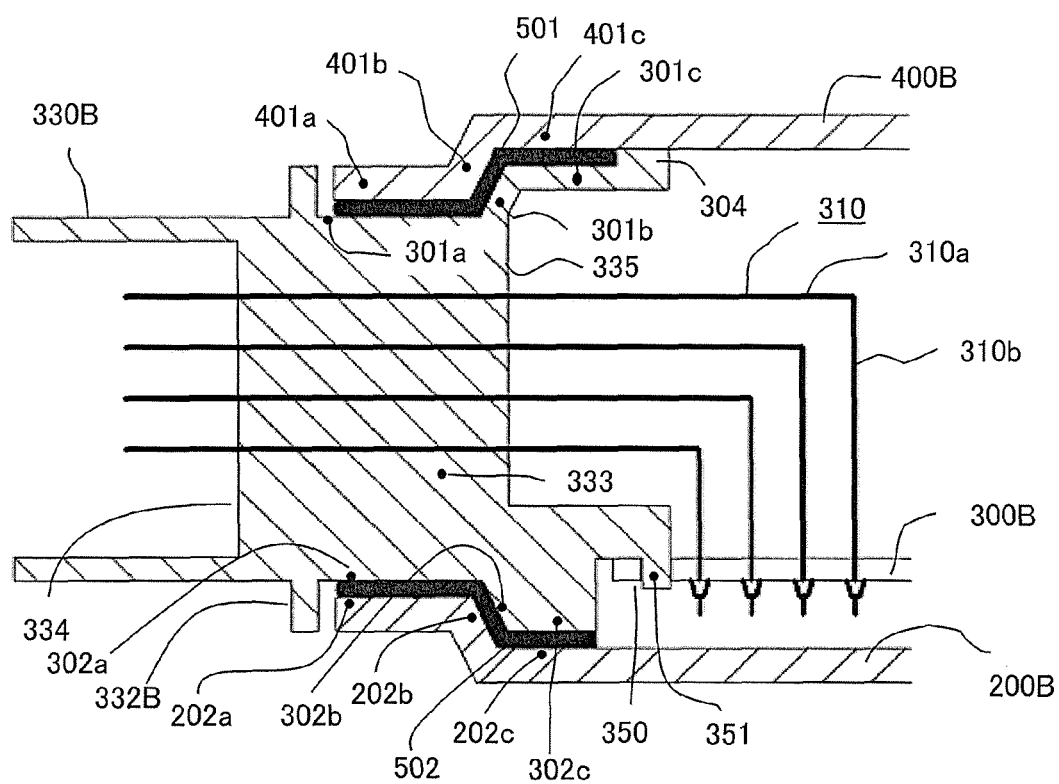
FIG. 10 is a detailed sectional view illustrating a connector housing of the waterproof control unit of FIG. 8.

Now, referring to FIG. 8, which is a plan view illustrating a waterproof control unit according to a second embodiment of the present invention, FIG. 9, which is a partially detailed sectional view illustrating mounting of a circuit board of the waterproof control unit of FIG. 8, and FIG. 10, which is a detailed sectional view illustrating a connector housing of the waterproof control unit of FIG. 8, detailed descriptions are mainly made of differences from the waterproof control unit illustrated in FIGS. 1 to 5B. Note that, in the drawings, the same or corresponding parts are represented by the same reference symbols.

In FIG. 8, a waterproof control unit 100B includes a base 200B, a circuit board 300B, and a cover 400B. The base 200B includes right and left mounting legs 211B, and is formed by sheet metal working. The circuit components 311 and the heat generating components 311a and 311b described later are mounted on the circuit board 300B. The cover 400B includes a flange on three outer peripheral wall portions, and is formed by sheet metal working. An opening portion closed by a connector housing 330B is formed in a part of the remaining one outer peripheral wall portion of the cover 400B. The circuit board 300B is sandwiched between the cover 400B and the base 200B, and the cover 400B and the base 200B are integrated by bending and caulk-folding pieces 413 provided at four corners of the cover 400B.

The connector housing 330B is mounted on one side of the circuit board 300B. A looped peripheral wall 332B described later with reference to FIG. 10 is provided in a projecting manner on an outer periphery of the connector housing 330B. Further, a protrusion piece 441 of the cover 400B is superimposed on a cutout portion of the looped peripheral wall 332B.

In the cutout portion of the looped peripheral wall 332B, a positioning protrusion 340B is provided in a projecting manner, and a positioning fitting hole 440B is formed in the protrusion piece 441 of the cover 400B. The positioning protrusion 340B is fitted into the positioning fitting hole 440B. Note that, the positioning fitting hole 440B is a circular hole, whereas the positioning protrusion 340B has an oblong shape. A relative position between the cover 400B and the connector housing 330B is regulated by the positioning fitting hole 440B and the positioning protrusion 340B.

In FIG. 9, on opposing surfaces extending along respective three sides of outer peripheries of the cover 400B and the base 200B, an undulating deformation portion 411 provided onto the cover 400B side and an undulating deformation portion 212 provided onto the base 200B side engage with each other to define the third sealing gap, to thereby form the convexo-concave sealing surfaces having the waterproof sealing material 503 applied therebetween.

As described above, the cover 400B and the base 200B are caulked and fixed with the folding pieces 413 provided at the four corners of the cover 400B. At this time, the cover 400B and the base 200B abut on each other at the gap-setting abutment surface 204, to thereby determine the gap dimension of the third sealing gap to which the waterproof sealing material 503 is to be applied.

The circuit board 300B includes the first heat generating component 311a mounted on a board surface on the cover 400B side, and the second heat generating component 311b mounted on a board surface on the base 200B side. The base 200B includes the first heat transfer base portion 361a adjacent to the bottom surface of the first heat generating component 311a, and the second heat transfer base portion 361b adjacent to the back surface of the second heat generating component 311b. The heat conductive adhesives 511a and 511b are applied to the surfaces of the first and second heat transfer base portions 361a and 361b, respectively.

Note that, in the above description, the circuit board 300B is sandwiched between the cover 400B and the base 200B, but may be fastened and fixed, with a plurality of fixing screws, to a plurality of fixing base portions (not shown) provided onto an inner surface of the base 200B. Further, instead of sandwiching the circuit board 300B between the respective three sides of the outer peripheries of the cover 400B and the base 200B, the circuit board 300B may be fastened and fixed to the cover 400B and the base 200B with fixing screws (not shown).

In FIG. 10, the connector housing 330B includes the looped peripheral wall 332B described above with reference to FIG. 8, and the partition wall 333 to which the contact terminals 310 of the right-angle type are press-fitted. A mating connector (not shown) is inserted at a position on an outer side of the outer boundary surface 334 of the partition wall 333, and mating contact terminals are inserted to establish contact connection to the ends of the contact terminals 310 on one side.

Horizontal portions 310a and perpendicular portions 310b of the contact terminals 310 are exposed at a position on an inner side of an inner boundary surface 335 of the partition wall 333. Distal ends of the perpendicular portions 310b pass through the front and back surfaces of the circuit board 300B, and are connected on the back surface side by soldering. Note that, when the perpendicular portions 310b of the contact terminals 310 are expanded and contracted due to a change in ambient temperature, the horizontal portions 310a are curved so as to prevent breakage of the solder-connection portion between the perpendicular portions 310b and the circuit board 300 B. When the horizontal portions 310a of the contact terminals 310 are expanded and contracted due to a change in ambient temperature, the perpendicular portions 310b are curved so as to prevent stress from being applied to the press-fitting portion between the horizontal portions 310a and the partition wall 333.

Further, on both sides of a left side of the circuit board 300B, a board hole 350 is provided, to which a positioning protrusion piece 351 such as a snap pin press-fitted to the connector housing 330B is fitted so as to regulate a relative mounting position between the connector housing 330B and the circuit board 300B.

At a left opening portion of the cover 400B where a part of the connector housing 330B is exposed, an outer-step flat portion 401a, a slope portion 401b, and an inner-step flat portion 401c are provided and opposed to an outer-step flat portion 301a, a slope portion 301b, and an inner-step flat portion 301c on the connector housing 330B side, respectively, to thereby define a first sealing gap. In the first sealing gap, a waterproof sealing material 501 is applied. Note that, the waterproof sealing material 501 is applied in a range beyond the inner boundary surface 335 of the partition wall 333. Further, at an inner end surface position of the inner-step flat portion 301c of the connector housing 330B, a plurality of gap-setting protrusions 304 are provided in a projecting manner, and abut on an inner surface of the cover 400B, to thereby restrict such a situation where the first sealing gap becomes extremely small.

The gap-setting protrusions 304 may be provided onto the inner surface side of the cover 400B, or may be provided onto the outer-step flat portion 301a of the connector housing 330B or the outer-step flat portion 401a of the cover 400B. On a left side of the base 200B opposed to the connector housing 330B, an outer-step flat portion 202a, a slope portion 202b, and an inner-step flat portion 202c are provided and opposed to an outer-step flat portion 302a, a slope portion 302b, and an inner-step flat portion 302c on the connector housing 330B side, respectively, to thereby define the second sealing gap. In the second sealing gap, the waterproof sealing material 502 is applied. Note that, the waterproof sealing material 502 is applied in a range beyond the inner boundary surface 335 of the partition wall 333. Further, at an inner end surface position of the inner-step flat portion 302c of the connector housing 330B, a plurality of gap-setting protrusions 304 (not shown) are provided in a projecting manner, and abut on the inner surface of the base 200B, to thereby restrict such a situation where the second sealing gap becomes extremely small.

The gap-setting protrusions 304 may be provided on the inner surface side of the base 200B, or may be provided onto the outer-step flat portion 302a of the connector housing 330B or the outer-step flat portion 202a of the base 200B. Note that, the second sealing gap may be regulated by a height of a mounting surface of the circuit board 300B and the base 200B. In this case, the gap-setting protrusions for the second sealing gap may be omitted. In the first and second sealing gaps, the respective portions are dimensioned so that the gap dimension between the outer-step flat portions becomes smaller than the gap dimension between the inner-step flat portions. With this consideration, when the waterproof sealing materials 501 and 502 are applied, the waterproof sealing materials 501 and 502 are hard to flow out but easy to flow in.

Figure 11A:
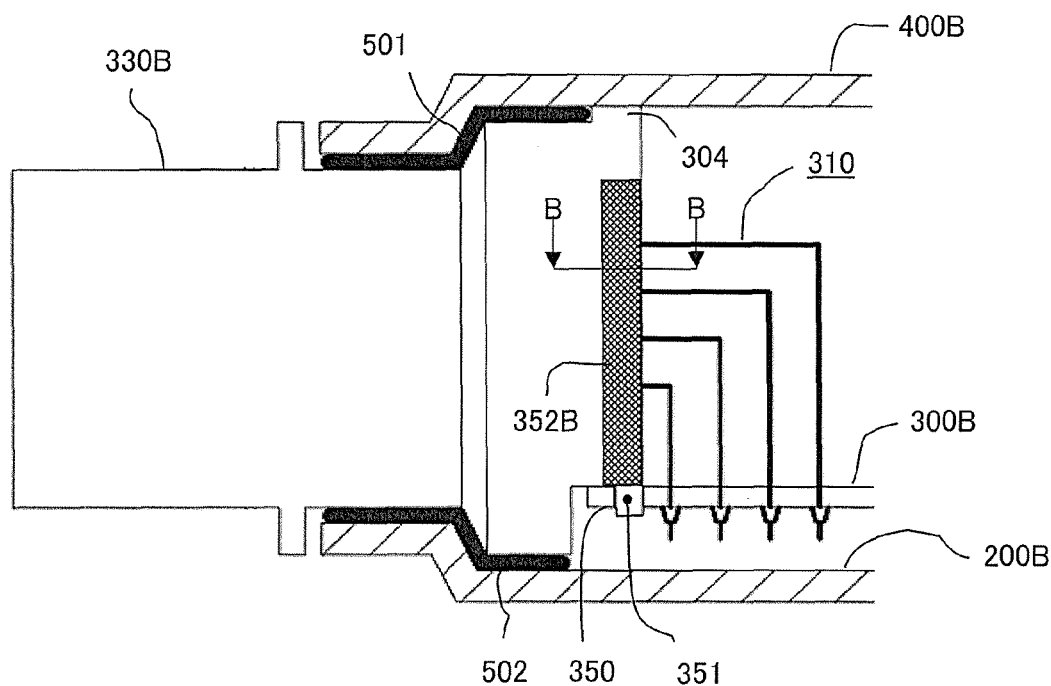
FIGS. 11A and 11B are detailed side views illustrating a connector housing as a modification of the connector housing of FIG. 10.
Figure 11B:
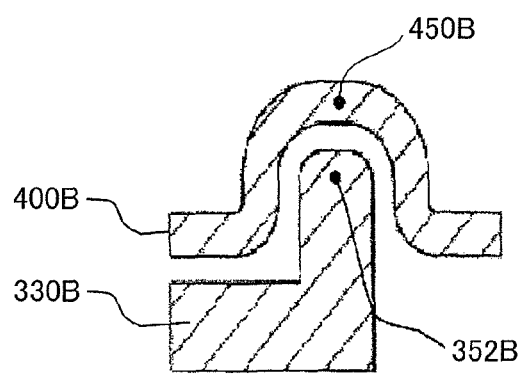

Next, descriptions are made of FIGS. 11A and 11B, which are detailed side views illustrating a connector housing as a modification of the connector housing of FIG. 10. Note that, FIG. 11A is a side view illustrating a connector housing 330B as a modification, and FIG. 11B is a local sectional view taken along the line B-B of FIG. 11A.

In FIGS. 11A and 11B, an exposed end surface of the connector housing 330B has a trapezoidal shape. On the right and left slopes of the trapezoid of the connector housing 330B, there are formed a pair of right and left (front and back sides of the drawing sheet of FIG. 11A) convexoconcave engagement surfaces including a pair of right and left side-surface convex threads 352B, which are provided in a projecting manner on the connector housing 330B, and fitting concave threads 450B of the cover 400B, which are loosely fitted onto the pair of side-surface convex threads, respectively. The pair of side-surface convex threads 352B and the pair of fitting concave threads 450B serve as auxiliary opposing members, which are added to a plane movement regulating member including the pair of opposing members that are the positioning protrusion 340A and the positioning fitting hole 440B illustrated in FIG. 8.

Thus, the convexoconcave engagement surfaces provided onto the side surfaces of the connector housing 330B serve also as an auxiliary plane movement regulating member. The gap dimension between the slopes of the connector housing 330B and the cover 400B can also be regulated by loose-fitting dimensions between the respective convexoconcave sealing surfaces. Note that, even when the loose-fitting dimensions between the pair of side-surface convex threads 352B and the pair of the fitting concave threads 450B are reduced and the side-surface convex threads 352B and the fitting concave threads 450B in this state serve as a main plane movement regulating member, the presence and absence of abnormality of the relative positional relationship among the cover 400B, the connector housing 330B, and the base 200B can be determined by visually confirming the fitting state between the positioning protrusion 340B and the positioning fitting hole 440B.

Figure 12:
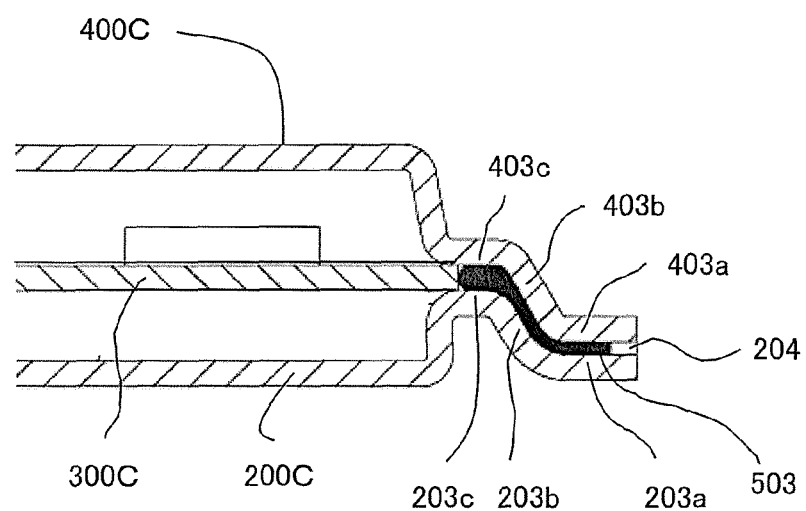
FIG. 12 is a partially detailed sectional view illustrating another modification of the mounting of the circuit board of FIG. 9.

Next, description is made of FIG. 12, which is a partially detailed sectional view illustrating another modification of the mounting of the circuit board of FIG. 9. In FIG. 12, a cover 400C includes an outer-step flat portion 403a, a slope portion 403b, and an inner-step flat portion 403c for defining the third sealing gap. A base 200C includes an outer-step flat portion 203a, a slope portion 203b, and an inner-step flat portion 203c for defining the third sealing gap. The base 200C has a gap-setting abutment surface 204. Thus, as compared to the third sealing gap of FIG. 9, the third sealing gap is defined by employing the step-slope system in place of the convexoconcave sealing surface system. The waterproof sealing material 503 is applied to the slope portions, the outer-step flat portions, and the inner-step flat portions, and an applied film thickness is determined by a height dimension of the gap-setting abutment surface 204. Note that, the other portions of the cover 400C and the base 200C are similar to those of the cover 400B and the base 200B.

Next, description is made of FIG. 13, which is a flow chart illustrating assembly of the waterproof control unit according to the second embodiment of the present invention. In FIG. 13, Step 800 is a start step for work of assembling the waterproof control unit 100B. Prior to the start step 800, preparation steps 803a, 803b, and 805b are carried out.

The preparation step 803a is a step of press-fitting and fixing the large number of contact terminals 310 to the partition wall 333 of the connector housing 330B, and press-fitting the positioning protrusion piece 351 such as a snap pin to the connector housing 330B and fitting and fixing the positioning protrusion piece 351 to the board hole 350 of the circuit board 300B. The preparation step 803b is a step of mounting and soldering the heat generating components 311a and 311b and the larger number of circuit components 311 onto the circuit board 300B, and soldering the ends of the contact terminals 310 on one side onto lands provided to the circuit board 300B, to thereby finish an "intermediate assembly body of the circuit board." The preparation step 805a is a step of bonding and fixing in advance a ventilation filter (not shown) to an inner bottom surface of the base 200B with an adhesive.

Step 801 subsequent to the start step 800 is a step of mounting the cover 400B onto an assembly jig under a reversed state. The subsequent Step 802 is a first processing step of applying the waterproof sealing material 501 to the first sealing gap surface of the cover 400B. The subsequent Step 803c is a second processing step of mounting, onto the inner surface of the cover 400B, the "intermediate assembly body of the circuit board" that is finished in the preparation step 803b, and joining, to the mating surface, the waterproof sealing material 501 applied in Step 802.

Further, as an additional processing step to be carried out in the second processing step, the heat conductive adhesives 511a and 511b are applied to the back surface of the circuit board 300B, which is opposite to the mounting position of the heat generating component 311a, and to the front surface of the heat generating component 311b, respectively. Step 804 subsequent to Step 803c is a third processing step of applying the pasty waterproof sealing materials 502 and 503 to the third sealing gap surface of the cover 400B and the second sealing gap surface of the connector housing 330B through a route of a looped shape.

Step 805b subsequent to Step 804 is a fourth processing step of mounting, onto the cover 400B under a reversed state, the base 200B having the ventilation filter bonded and fixed thereto in the preparation step 805a, joining, to the mating surfaces, the heat conductive adhesives 511a and 511b applied in Step 803c and the waterproof sealing materials 502 and 503 applied in Step 804, and integrating and fixing the cover 400B and the base 200B with caulking members or screws.

Subsequent Step 806 is a step of carrying out initial setting, performance inspection, and visual inspection of the waterproof control unit 100B, while drying, at room temperature or under a heated condition, the heat conductive adhesives 511a and 511b and the waterproof sealing materials 501, 502, and 503 applied in Step 803c and Step 804. Thus, the processing proceeds to a general assembly completion step 807.

Note that, as the visual inspection, it is determined whether or not the cover 400B, the connector housing 330B, and the base 200B have a proper relative positional relationship by inspecting the fitting state between the positioning fitting hole (not shown) formed in the base 200B and the positioning protrusion (not shown) formed on the connector housing 330B, and by carrying out visual determination or automatic determination using image recognition through comparison with a standard sample.

Note that, when an electronic camera is provided on a back surface of the assembly jig so as to image the fitting state between the positioning fitting hole 440B and the positioning protrusion 340B on the cover 400B side and the obtained image is displayed on a screen in an enlarged scale, constant monitoring can be carried out even when the positioning fitting hole 440B and the positioning protrusion 340B are not formed on the base 200B side.

Alternatively, as visual inspection by sampling, it may be determined whether or not the cover 400B, the connector housing 330B, and the base 200B have a proper relative positional relationship by inspecting the fitting state between the positioning fitting hole 440B formed in the cover 400B and the positioning protrusion 340B formed on the connector housing 330B, and by carrying out visual determination or automatic determination using image recognition through comparison with a standard sample.

Thus, variations in relative positional relationship among the cover 400B, the connector housing 330B, and the base 200B due to a difference among production lots are observed so as to determine the presence and absence of a difference that may be caused depending on the production lots, to thereby confirm whether or not unintended fluctuations occur. Note that, the transfer operation between the respective steps other than the inspection by sampling, the processing of applying the heat conductive adhesives and the waterproof sealing materials, the screw fastening processing, and the like are all carried out automatically, and the heat conductive adhesives and the waterproof sealing materials are controlled to be applied in appropriate amounts so as to prevent any excess and deficiency.

As is apparent from the above-mentioned description, the waterproof control unit 100B according to the second embodiment of the present invention includes the casing including the base 200B and the cover 400B, and the circuit board 300B hermetically housed in the casing, onto which the circuit component 311 and the plurality of external connection contact terminals 310 are mounted, and the connector housing 330B made of the resin forming material is positioned and fixed, in which, in order to expose, from the casing, the end surface of the connector housing 330B having the plurality of external connection contact terminals 310 passing therethrough, the waterproof sealing materials 501, 502, and 503 filled into the first sealing gap defined between opposing surfaces of the connector housing 330B and the cover 400B, the second sealing gap defined between opposing surfaces of the connector housing 330B and the base 200B, and the third sealing gap defined between opposing surfaces of the base 200B and the cover 400B, respectively, are provided, and in which at least one of the sealing gap out of the first sealing gap and the second sealing gap includes a narrow-gap space defined by the pair of slope portions 301b, 401b, 302b, and 202b formed by the connector housing 330B and the cover 400B or the connector housing 330B and the base 200B, a part of the pair of outer-step flat portions 301a, 401a, 302a, and 202a communicating to the pair of the slope portions 301b, 401b, 302b, and 202b, and a part of the pair of inner-step flat portions 301c, 401c, 302c, and 202c, the pair of outer-step flat portions 301a, 401a, 302a, and 202a being positioned on an outer side of the casing with respect to the pair of inner-step flat portions 301c, 401c, 302c, and 202c.

Further, the waterproof control unit 100B includes the gap regulating member and the plane movement regulating member provided between the connector housing 330B and the cover 400B, defining the first sealing gap, or between the connector housing 330B and the base 200B, defining the second sealing gap. The gap regulating member is provided to the outer-step flat portions 301a, 401a, 302a, and 202a of the connector housing 330B and the cover 400B, or of the connector housing 330B and the base 200B, or the inner-step flat portions 301c, 401c, 302c, 202c of the connector housing 330B and the cover 400B, or of the connector housing 330B and the base 200B, and is a gap-setting protrusion 304 being brought into abutment on another side. The plane movement regulating member includes at least the pair of opposing members for regulating the relative position of the connector housing 330B so that the horizontal gap dimension between the pair of slope portions 301b, 401b, 302b, and 202b of the connector housing 330B and the cover 400B, or of the connector housing 330B and the base 200B falls within a predetermined range. The pair of opposing members include the positioning protrusion 340B formed on the connector housing 330B, the cover 400B or the base 200B, and the positioning fitting hole 440B formed on another side, the positioning protrusion 340B being loosely fitted into the positioning fitting hole 440B.

The positioning protrusion 340B serving as the plane movement regulating member is formed on the outer-step flat portion 301a or 302a of the connector housing 330B, and the positioning fitting hole 440B serving as the plane movement regulating member is formed in the outer-step flat portion 401a or 202a of the cover 400B or the base 200B.

As described above, according to claim 2 of the present invention, the gap-setting protrusion serving as the gap regulating member is provided onto the inner or outer side of the sealing portion. The positioning protrusion and the positioning fitting hole serving as the plane movement regulating member are arranged on the outer side of the sealing portion, and the positioning protrusion is provided in a projecting manner on the connector housing side. Thus, similarly to the case of the first embodiment, the present invention has features in that the fitting state between the positioning protrusion and the positioning fitting hole can visually be confirmed at the stage of assembling the casing, and that, in practical use, the water does not enter the casing through the positioning fitting hole.

The connector housing 330B includes the partition wall 333, to which the plurality of contact terminals 310 of the right-angle type are press-fitted and held, in which the end surface of the connector housing has a trapezoid shape, in which a long base of the trapezoid is positioned by the positioning protrusion piece 351 and the board hole 350, and is fixed to one side of the circuit board 300B. The portion of the connector housing projecting beyond the one side of the circuit board 300B is opposed to the base 200B via the second sealing gap, and is opposed to an opening portion of a side surface of the cover 400B via the first sealing gap, relative to a short top of the trapezoid, or relative to the short top of the trapezoid and right and left slopes of the trapezoid. Among the one of the pair of outer-step flat portions 301a and 401a, the one of the pair of slope portions 301b and 401b, and the one of the pair of inner-step flat portions 301c and 401c, defining the first sealing gap, at least a part of the pair of inner-step flat portions 301c and 401c enters an inner side of the casing beyond the inner boundary surface 335 of the partition wall 333.

As described above, according to claim 3 of the present invention, among the outer-step flat portions, the slope portions, and the inner-step flat portions, defining the first sealing gap between the connector housing and the cover, at least the part of the inner-step flat portions is extended toward the inner side of the partition wall provided onto the connector housing. Thus, similarly to the case of the first embodiment, the present invention has a feature in that it is possible to enhance the water resistance by extending the sealing path through extension of the first sealing gap utilizing a free space around the exposed contact terminals, or to suppress, when assuming the sealing paths of an equal length, a situation where the connector housing has a long body dimension.

The looped peripheral wall 332B is provided upright at a boundary position between an exposed portion and a non-exposed portion of the connector housing 330B.

As described above, according to claim 5 of the present invention, the looped peripheral wall is provided at the intermediate portion of the connector housing. Thus, similarly to the case of the first embodiment, the present invention has a feature in that the waterproof sealing material is prevented from flowing out through the sealing gap defined by the pair of outer-step flat portions at the stage of the assembly process.

An outer-step narrow-gap distance between the pair of outer-step flat portions 301a, 401a, 302a, and 202a is smaller in value than an inner-step narrow-gap distance between the pair of inner-step flat portions 301c, 401c, 302c, and 202c.

As described above, according to claim 6 of the present invention, the outer-step narrow-gap distance between the outer-step flat portions positioned on the outer side of the sealing portion is smaller in value than the inner-step narrow-gap distance between the inner-step flat portions positioned on the inner side of the sealing portion. Thus, similarly to the case of the first embodiment, the waterproof sealing material applied between the sealing surfaces is easy to flow into the gap between the sealing surfaces without flowing out of the gap between the sealing surfaces. Accordingly, the present invention has a feature in that the narrow-gap space can reliably be filled through control of an appropriate amount of application of the waterproof sealing material.

The exposed end surface of the connector housing 330B has a trapezoid shape, in which one side surface of the cover 400B has an opening portion formed into a trapezoid shape having an upper top, in which a long base of the trapezoid of the connector housing 330B is positioned by the positioning protrusion piece 351 and the board hole 350, and is fixed to one side of the circuit board 300B, and a portion of the connector housing projecting beyond the one side of the circuit board 300B is opposed to the base 200B via the second sealing gap, in which a short top of the trapezoid of the connector housing 330B is opposed to an upper top of the one side surface opening of the cover 400B via the first sealing gap, and in which each of a right slope and a left slope of the trapezoid of the connector housing 330B includes, similarly to the first sealing gap, a narrow-gap space defined by the pair of slope portions 301b and 401b formed by the connector housing 330B and the cover 400B, a part of the pair of outer-step flat portions 301a and 401a communicating to the pair of slope portions, and a part of the pair of inner-step flat portions 301c and 401c, the pair of outer-step flat portions 301a and 401a being positioned on an outer side of the casing with respect to the pair of inner-step flat portions 301c and 401c.

As described above, according to claim 7 of the present invention, the exposed end surface of the connector housing and the opening portion of the side surface of the cover have the shapes of the trapezoids, and the short tops, the right slopes, and the left slopes of the opposing trapezoids of the connector housing and the cover define the first sealing gap. Thus, similarly to the case of the first embodiment, the present invention has features in that the waterproof sealing material can smoothly be applied so as to flow from the slope portions to the upper tops of the trapezoids, and that a cover made of a sheet metal material or a cover made of a resin forming material with a simple die can be used.

The exposed end surface of the connector housing 330B has a trapezoid shape, in which one side surface of the cover 400B has an opening portion formed into a trapezoid shape having an upper top, in which a long base of the trapezoid of the connector housing 330B is positioned by the positioning protrusion piece 351 and the board hole 350, and is fixed to one side of the circuit board 300B, and a portion of the connector housing projecting beyond the one side of the circuit board 300B is opposed to the base 200B via the second sealing gap, in which a short top, a right slope, and a left slope of the trapezoid of the connector housing 330B are opposed to an upper top portion, a right slope portion, and a left slope portion of the one side surface opening of the cover 400B via the first sealing gap, respectively, and in which each of the right slopes and the left slopes of the trapezoid of the connector housing 330B includes a convexoconcave engagement surface, the convexoconcave engagement surface including: the side-surface convex thread 352B, which is provided in a projecting manner on the connector housing 330B; and the fitting concave thread 450B of the cover 400B, which is loosely fitted onto the side-surface convex thread 352B, the side-surface convex thread 352B and the fitting concave thread 450B serving as auxiliary opposing members added to the plane movement regulating member.

As described above, according to claim 8 of the present invention, the exposed end surface of the connector housing and the opening portion of the side surface of the cover have the shapes of the trapezoids, and the right slopes and the left slopes of the opposing trapezoids of the connector housing and the cover are loosely fitted and engaged with each other by the respective convexoconcave engagement surfaces. Thus, similarly to the case of the first embodiment, the convexoconcave engagement surfaces serve also as the auxiliary plane movement regulating member. Accordingly, the present invention has a feature in that the gap dimension between the slopes of the connector housing and the cover can also be regulated by the loose-fitting dimensions between the respective convexoconcave sealing surfaces.

The covers 400B and 400C and the bases 200B and 200C are manufactured by press-working a sheet metal material. Each of the first sealing gap and the second sealing gap is a narrow-gap space defined by the pair of slope portions 301b, 401b, 302b, and 202b, the part of the pair of outer-step flat portions 301a, 401a, 302a, and 202a communicating to the pair of slope portions 301b, 401b, 302b, and 202b, and the part of the pair of inner-step flat portions 301c, 401c, 302c, and 202c. The gap-setting protrusion 304 serving as the gap regulating member and the plane movement regulating members 340B and 440B are provided in the gaps between the connector housing 330B and the cover 400B and the connector housing 330B and the cover 400C, defining the first sealing gap, and in the gaps between the connector housing 330B and the base 200B and the connector housing 330B and the cover 200C, defining the second sealing gap. The third sealing gap is a narrow-gap space defined by opposing the pair of undulating deformation portions 411 and 212 provided onto three sides of an outer peripheral contour portion of the covers 400B and 400C, and onto three sides of an outer peripheral contour portion of the bases 200B and 200C, or a narrow-gap space defined by the pair of slope portions 403b and 203b, a part of the pair of outer-step flat portions 403a and 203a communicating to the pair of slope portions 403b and 203b, and a part of the pair of inner-step flat portions 403c and 203c. The narrow-gap space of the third sealing gap has the gap-setting abutment surface 204 serving as a gap regulating member for securing a predetermined gap dimension when the covers 400B and 400C and the bases 200B and 200C are fastened and fixed to each other.

As described above, according to claim 10 of the present invention, the gap dimensions of the first to third sealing gaps are determined by the gap regulating members provided in the respective narrow-gap spaces, and the relative positional relationships between the connector housing and the cover and between the connector housing and the base are determined by the plane movement regulating members provided in the first and second sealing gaps. Thus, the present invention has features in that: the assembly fluctuations in gap dimensions in the plane direction between the slope portions in the first and second sealing gaps or in the first to third sealing gaps can be suppressed; in the gap between the connector housing and the cover, which are liable to cause the assembly dimension error, the assembly dimension error can be absorbed by the fluctuation error in horizontal gap dimension between the slope portions; and the fitting state between the positioning protrusion and the positioning fitting hole can visually be confirmed so as to determine whether or not the fluctuation error falls within a proper range.

As is apparent from the above-mentioned description, the method of assembling the waterproof control unit described in the second embodiment includes: the first processing step 802 of mounting the cover 400B onto the jig under the reversed state, and applying, into the non-looped shape, the pasty waterproof sealing material 501 to the sealing surface of the cover 400B, defining the first sealing gap; the second processing step 803c of mounting, onto the stepped portions provided along three sides of the outer periphery of the cover 400B, the circuit board 300B having the circuit component 311 and the connector housing 330B mounted and soldered thereonto in advance, to thereby join the connector housing 330B and the cover 400B; the third processing step 804 of applying, into the looped shape, the pasty waterproof sealing materials 502 and 503 to a sealing surface of the cover 400B, which is subjected to the second processing step 803c, the sealing surface defining the third sealing gap, and to a sealing surface of the connector housing 330B, defining the second sealing gap; and the fourth processing step 805b of mounting the base 200B onto the cover 400B, which is subjected to the third processing step 804, integrating and fixing the cover 400B and the base 200B, and sandwiching and fixing the circuit board 300B by three sides of the outer periphery of the base 200B and the three sides of the outer periphery of the cover 400B.

Further, the second processing step 803c includes an additional processing step of applying, for a waterproof control unit including, as the circuit component 311, the first heat generating component 311a mounted on the surface of the circuit board 300B, which is opposed to the cover 400B, or the second heat generating component 311b mounted on the surface of the circuit board 300B, which is opposed to the base 200B, and including, on the base 200B, the first heat transfer base portion 361a adjacent to the bottom surface of the first heat generating component 311a, or the second heat transfer base portion 361b adjacent to the back surface of the second heat generating component 311b, the pasty heat conductive adhesive 511a or 511b to the surface of the circuit board 300B, which corresponds to the first or second heat transfer base portion 361a or 361b. The second sealing gap between the base 200B and the connector housing 330B and the third sealing gap between the base 200B and the cover 400B are the convexoconcave sealing surfaces having the concave threads mainly on the connector housing 330B side and the cover 400B side, or include the inner-step flat portions, the slope portions, and the outer-step flat portions. The method further includes drying and curing, after finishing the fourth processing step 805b, the pasty waterproof sealing materials 501, 502, and 503 and the pasty heat conductive adhesive 511a or 511b by standing at room temperature or heating while carrying out visual inspection and performance inspection.

As described above, according to the second assembling method of the present invention, after the waterproof sealing material is applied to the sealing surface of the cover, defining the first sealing gap, the circuit board including the connector housing is mounted on the cover. Subsequently, the waterproof sealing materials are applied, into a looped shape, to the sealing surfaces of the cover and the connector housing, defining the third sealing gap and the second sealing gap, respectively, and then the cover and the base are coupled to each other and all the components are integrated and fixed. After that, the visual inspection and the performance inspection are carried out. Thus, the joining processing is carried out immediately after the waterproof sealing materials are applied, and hence there is no risk of joining failure due to the drying of the waterproof sealing materials. Accordingly, there is an effect in that the opposing state of the sealing surfaces can be monitored by confirming the fitting state between the positioning fitting hole and the positioning protrusion. Further, the waterproof sealing materials, which are to be applied into a looped shape so as to surround the peripheries of the cover and the connector housing in the third processing step, are applied to the concave thread groove surface of the convexoconcave sealing surfaces or the boundary position between the slope portion and the inner-step flat portion. Accordingly, there is an effect in that the work of applying the waterproof sealing materials is facilitated. Still further, there are effects in that all the assembly steps can be carried out with one type of jig, and that the step of screwing the circuit board to the base can be omitted.

What is claimed is:

1. A waterproof control unit, comprising:
   a casing comprising a base and a cover;
   a circuit board hermetically housed in the casing,
      the circuit board including a circuit component and a plurality of external connection contact terminals having mounted thereon,
      the circuit board including a connector housing made of a resin forming material having positioned and fixed thereto;
   a first sealing gap defined between opposing surfaces of the connector housing and the cover;
   a second sealing gap defined between opposing surfaces of the connector housing and the base; and
   a third sealing gap defined between opposing surfaces of the base and the cover,
      the first sealing gap, the second sealing gap, and the third sealing gap each being filled with a waterproof sealing material, and being provided so as to expose, from the casing, an end surface of the connector housing having the plurality of external connection contact terminals passing through the end surface,
   at least one of the first sealing gap and the second sealing gap comprising: a narrow-gap space defined by a pair of slope portions formed by the connector housing and one of the cover and the base; apart of a pair of outer-step flat portions communicating to the pair of slope portions; and a part of a pair of inner-step flat portions,
      the pair of outer-step flat portions being positioned on an outer side of the casing with respect to the pair of inner-step flat portions,
   the waterproof control unit further comprising a gap regulating member and a plane movement regulating member provided in one of the gap between the connector housing and the cover, defining the first sealing gap and the gap between the connector housing and the base, defining the second sealing gap, the gap regulating member comprising a gap-setting protrusion provided on one of the pair of outer-step flat portions, which are formed by the connector housing and the one of the cover and the base, or one of the pair of inner-step flat portions, which are formed by the connector housing and the one of the cover and the base, the gap-setting protrusion being brought into abutment on another of the pair of outer-step flat portions or another of the pair of inner-step flat portions, the plane movement regulating member comprising at least a pair of opposing members for regulating a relative position of the connector housing so that a horizontal gap dimension between the pair of slope portions, which are formed by the connector housing and the one of the cover and the base, falls within a predetermined range, the pair of opposing members comprising:
- a positioning protrusion formed on one of the connector housing and the cover, or on one of the connector housing and the base; and
- a positioning fitting hole formed on another of the connector housing and the cover, or on another of the connector housing and the base,
  - the positioning protrusion being loosely fitted into the positioning fitting hole.

2. A waterproof control unit according to claim 1,
wherein the positioning protrusion serving as the plane movement regulating member is formed on one of the pair of outer-step flat portions of the connector housing, and
wherein the positioning fitting hole serving as the plane movement regulating member is formed in another of the pair of outer-step flat portions of the one of the cover and the base.

3. A waterproof control unit according to claim 2,
wherein the connector housing comprises a partition wall, to which the plurality of external connection contact terminals of a right-angle type are press-fitted and held,
wherein the end surface of the connector housing has a trapezoid shape,
wherein a long base of the trapezoid is positioned by a positioning protrusion piece and a board hole, and is fixed to one side of the circuit board,
wherein a portion of the connector housing projecting beyond the one side of the circuit board is opposed to the base via the second sealing gap, and is opposed to an opening portion of a side surface of the cover via the first sealing gap, relative to a short top of the trapezoid, or relative to the short top of the trapezoid and right and left slopes of the trapezoid,
wherein, among the one of the pair of outer-step flat portions, the one of the pair of slope portions, and the one of the pair of inner-step flat portions, defining the first sealing gap, at least a part of the one of the pair of inner-step flat portions enters an inner side of the casing beyond an inner boundary surface of the partition wall.

4. A waterproof control unit according to claim 3, wherein the connector housing comprises a looped peripheral wall provided upright at a boundary position between an exposed portion and a non-exposed portion of the connector housing.

5. A waterproof control unit according to claim 3, wherein an outer-step narrow-gap distance between the pair of outer-step flat portions is smaller in value than an inner-step narrow-gap distance between the pair of inner-step flat portions.

6. A waterproof control unit according to claim 3,
wherein the exposed end surface of the connector housing has a trapezoid shape,
wherein one side surface of the cover has an opening portion formed into a trapezoid shape having an upper top,
wherein a long base of the trapezoid of the connector housing is positioned by a positioning protrusion piece and a board hole, and is fixed to one side of the circuit board, and a portion of the connector housing projecting beyond the one side of the circuit board is opposed to the base via the second sealing gap,
wherein the short top of the trapezoid of the connector housing is opposed to an upper top of the one side surface opening of the cover via the first sealing gap, and
wherein each of the right slope and a left slope of the trapezoid of the connector housing comprises, similarly to the first sealing gap, a narrow-gap space defined by a pair of slope portions formed by the connector housing and the cover, a part of a pair of outer-step flat portions communicating to the pair of slope portions, and a part of a pair of inner-step flat portions,
the pair of outer-step flat portions being positioned on an outer side of the casing with respect to the pair of inner-step flat portions.

7. A waterproof control unit according to claim 3,
wherein the cover is manufactured by press-working a sheet metal material,
wherein the base is manufactured by press-working a sheet metal material,
wherein the narrow-gap space defined by the pair of slope portions, the part of the pair of outer-step flat portions communicating to the pair of slope portions, and the part of the pair of inner-step flat portions is provided as both of the first sealing gap and the second sealing gap,
wherein the gap-setting protrusion serving as the gap regulating member and the plane movement regulating member are provided at the gap between the connector housing and the cover, defining the first sealing gap and the gap between the connector housing and the base, defining the second sealing gap,
wherein the third sealing gap comprises one of:
- a narrow-gap space defined by opposing a pair of undulating deformation portions provided onto three sides of an outer peripheral contour portion of the cover, and onto three sides of an outer peripheral contour portion of the base; and
- a narrow-gap space defined by a pair of slope portions, a part of a pair of outer-step flat portions communicating to the pair of slope portions, and a part of a pair of inner-step flat portions, and wherein the narrow-gap space of the third sealing gap has a gap-setting abutment surface serving as a gap regulating member for securing a predetermined gap dimension when the cover and the base are fastened and fixed to each other.

8. A waterproof control unit according to claim 3,
wherein the exposed end surface of the connector housing has a trapezoid shape,
wherein one side surface of the cover has an opening portion formed into a trapezoid shape having an upper top,
wherein a long base of the trapezoid of the connector housing is positioned by a positioning protrusion piece and a board hole, and is fixed to one side of the circuit board, and a portion of the connector housing projecting beyond the one side of the circuit board is opposed to the base via the second sealing gap, wherein a short top, a right slop, and a left slop of the trapezoid of the connector housing are opposed to an upper top, a right slope, and a left slope of the one side surface opening of the cover via the first sealing gap, respectively, and wherein each of the right slope and the left slope of the trapezoid of the connector housing comprises a convexoconcave engagement surface, the convexoconcave engagement surface comprising:
- a side-surface convex thread, which is provided in a projecting manner on the connector housing; and
- a fitting concave thread of the cover, which is loosely fitted onto the side-surface convex thread,
  the side-surface convex thread and the fitting concave thread serving as auxiliary opposing members added to the plane movement regulating member.

9. A waterproof control unit according to claim 3,
wherein the cover is manufactured by molding a resin material with a die,
wherein the base is manufactured by molding an aluminum material with a die,
wherein the narrow-gap space defined by the pair of slope portions, the part of the pair of outer-step flat portions communicating to the pair of slope portions, and the part of the pair of inner-step flat portions is provided as the first sealing gap,
wherein the gap-setting protrusion serving as the gap regulating member and the plane movement regulating member are provided at the gap between the connector housing and the cover, defining the first sealing gap,
wherein the second sealing gap and the third sealing gap each have a convexoconcave shape in cross sections of the sealing surfaces, and each comprise a narrow-gap space defined by meshing and fitting to each other,
wherein the narrow-gap space of each of the second sealing gap and the third sealing gap has a gap-setting abutment surface serving as a gap regulating member for securing a predetermined gap dimension when the cover and the base are fastened and fixed to each other,
wherein a horizontal gap dimension between the pair of slope portions in the first sealing gap is equal to or larger than a loose-fitting dimension between the convexoconcave sealing surfaces in the each of the second sealing gap and the third sealing gap,
wherein, when the cover is shifted to one side, before the pair of slope portions abut on each other, a side surface of a convex surface and a side surface of a concave surface of the convexoconcave sealing surfaces abut on each other so as to regulate an excessively small horizontal gap from being defined between the pair of slope portions, and
wherein, when the cover is shifted to another side, another side surface of the convex surface and another side surface of the concave surface of the convexoconcave sealing surfaces abut on each other so as to regulate an excessively large horizontal gap from being defined between the pair of slope portions.

10. A waterproof control unit according to claim 2,
wherein the positioning protrusions are formed at least at two positions on the one of the pair of outer-step flat portions, which are formed by the connector housing and the one of the cover and the base,
wherein the positioning fitting holes are formed at least at two positions on the another of the pair of outer-step flat portions, which are formed by the connector housing and the one of the cover and the base,
wherein the positioning fitting holes each comprise a circular hole, and
wherein the positioning protrusions each have an oblong shape in cross section and are inclined into an inverted V-shape, in which an intersection between major axes of the pair of the positioning protrusions is positioned on an outer side of the end surface of the connector housing.

11. A waterproof control unit according to claim 2, wherein the connector housing comprises a looped peripheral wall provided upright at a boundary position between an exposed portion and a non-exposed portion of the connector housing.

12. A waterproof control unit according to claim 2, wherein an outer-step narrow-gap distance between the pair of outer-step flat portions is smaller in value than an inner-step narrow-gap distance between the pair of inner-step flat portions.

13. A waterproof control unit according to claim 2,
wherein the exposed end surface of the connector housing has a trapezoid shape,
wherein one side surface of the cover has an opening portion formed into a trapezoid shape having an upper top,
wherein a long base of the trapezoid of the connector housing is positioned by a positioning protrusion piece and a board hole, and is fixed to one side of the circuit board, and a portion of the connector housing projecting beyond the one side of the circuit board is opposed to the base via the second sealing gap,
wherein the short top of the trapezoid of the connector housing is opposed to an upper top of the one side surface opening of the cover via the first sealing gap, and
wherein each of the right slope and a left slope of the trapezoid of the connector housing comprises, similarly to the first sealing gap, a narrow-gap space defined by a pair of slope portions formed by the connector housing and the cover, a part of a pair of outer-step flat portions communicating to the pair of slope portions, and a part of a pair of inner-step flat portions,
the pair of outer-step flat portions being positioned on an outer side of the casing with respect to the pair of inner-step flat portions.

14. A waterproof control unit according to claim 2,
wherein the exposed end surface of the connector housing has a trapezoid shape,
wherein one side surface of the cover has an opening portion formed into a trapezoid shape having an upper top,
wherein a long base of the trapezoid of the connector housing is positioned by a positioning protrusion piece and a board hole, and is fixed to one side of the circuit board, and a portion of the connector housing projecting beyond the one side of the circuit board is opposed to the base via the second sealing gap,
wherein a short top, a right slop, and a left slop of the trapezoid of the connector housing are opposed to an upper top, a right slope, and a left slope of the one side surface opening of the cover via the first sealing gap, respectively, and
wherein each of the right slope and the left slope of the trapezoid of the connector housing comprises a convexoconcave engagement surface, the convexoconcave engagement surface comprising:
- a side-surface convex thread, which is provided in a projecting manner on the connector housing; and
- a fitting concave thread of the cover, which is loosely fitted onto the side-surface convex thread,
  the side-surface convex thread and the fitting concave thread serving as auxiliary opposing members added to the plane movement regulating member.

15. A waterproof control unit according to claim 2,
wherein the cover is manufactured by molding a resin material with a die,
wherein the base is manufactured by molding an aluminum material with a die,
wherein the narrow-gap space defined by the pair of slope portions, the part of the pair of outer-step flat portions communicating to the pair of slope portions, and the part of the pair of inner-step flat portions is provided as the first sealing gap,
wherein the gap-setting protrusion serving as the gap regulating member and the plane movement regulating member are provided at the gap between the connector housing and the cover, defining the first sealing gap,
wherein the second sealing gap and the third sealing gap each have a convexoconcave shape in cross sections of the sealing surfaces, and each comprise a narrow-gap space defined by meshing and fitting to each other,
wherein the narrow-gap space of each of the second sealing gap and the third sealing gap has a gap-setting abutment surface serving as a gap regulating member for securing a predetermined gap dimension when the cover and the base are fastened and fixed to each other,
wherein a horizontal gap dimension between the pair of slope portions in the first sealing gap is equal to or larger than a loose-fitting dimension between the convexoconcave sealing surfaces in the each of the second sealing gap and the third sealing gap,
wherein, when the cover is shifted to one side, before the pair of slope portions abut on each other, a side surface of a convex surface and a side surface of a concave surface of the convexoconcave sealing surfaces abut on each other so as to regulate an excessively small horizontal gap from being defined between the pair of slope portions, and
wherein, when the cover is shifted to another side, another side surface of the convex surface and another side surface of the concave surface of the convexoconcave sealing surfaces abut on each other so as to regulate an excessively large horizontal gap from being defined between the pair of slope portions.

16. A waterproof control unit according to claim 2,
wherein the cover is manufactured by press-working a sheet metal material,
wherein the base is manufactured by press-working a sheet metal material,
wherein the narrow-gap space defined by the pair of slope portions, the part of the pair of outer-step flat portions communicating to the pair of slope portions, and the part of the pair of inner-step flat portions is provided as both of the first sealing gap and the second sealing gap,
wherein the gap-setting protrusion serving as the gap regulating member and the plane movement regulating member are provided at the gap between the connector housing and the cover, defining the first sealing gap and the gap between the connector housing and the base, defining the second sealing gap,
wherein the third sealing gap comprises one of:
a narrow-gap space defined by opposing a pair of undulating deformation portions provided onto three sides of an outer peripheral contour portion of the cover, and onto three sides of an outer peripheral contour portion of the base; and
a narrow-gap space defined by a pair of slope portions, a part of a pair of outer-step flat portions communicating to the pair of slope portions, and a part of a pair of inner-step flat portions, and
wherein the narrow-gap space of the third sealing gap has a gap-setting abutment surface serving as a gap regulating member for securing a predetermined gap dimension when the cover and the base are fastened and fixed to each other.

17. A method of assembling the waterproof control unit according to claim 1, the method comprising:
a first processing step of mounting a base onto a first jig, and applying, into a non-looped shape, a pasty waterproof sealing material to a sealing surface of the base, defining a second sealing gap;
a second processing step of mounting and fixing, onto the base, a circuit board having a circuit component and a connector housing mounted and soldered thereonto in advance, to thereby join the connector housing and the base;
a third processing step of mounting a cover onto a second jig under a reversed state, and applying, into a looped shape, a pasty waterproof sealing material to a sealing surface of the cover, defining a first sealing gap, and a pasty waterproof sealing material to the sealing surface of the cover, defining a third sealing gap;
a fourth processing step of placing the base and the circuit board including the connector housing, which are subjected to the second processing step, onto the cover subjected to the third processing step so that the base and the circuit board are opposed to the cover, to thereby integrate and fix the cover and the base; and
a preliminary processing step of applying, for a waterproof control unit comprising, as the circuit component, one of a first heat generating component mounted on a surface of the circuit board, which is opposed to the cover, and a second heat generating component mounted on a surface of the circuit board, which is opposed to the base, and comprising, on the base, one of a first heat transfer base portion adjacent to a bottom surface of the first heat generating component and a second heat transfer base portion adjacent to a back surface of the second heat generating component, a pasty heat conductive adhesive to one of a surface of the first heat transfer base portion and a surface of the second heat transfer base portion at a stage prior to the first processing step,
the first sealing gap between the cover and the connector housing being defined by a pair of inner-step flat portions, a pair of slope portions, and a pair of outer-step flat portions,
the third sealing gap between the cover and the base being a convexoconcave sealing surface having a concave thread mainly on the cover side, or including inner-step flat portions, slope portions, and outer-step flat portions,
the method further comprising drying and curing, after finishing the fourth processing step, the pasty waterproof sealing materials and the pasty heat conductive adhesive by one of standing at room temperature and heating while carrying out visual inspection and performance inspection.

18. A method of assembling the waterproof control unit according to claim 1, the method comprising:
a first processing step of mounting a cover onto a jig under a reversed state, and applying, into a non-looped shape, a pasty waterproof sealing material to a sealing surface of the cover, defining a first sealing gap;
a second processing step of mounting, onto stepped portions provided along three sides of an outer periphery of the cover, a circuit board having a circuit component and a connector housing mounted and soldered thereonto in advance, to thereby join the connector housing and the cover;

a third processing step of applying, into a looped shape, a pasty waterproof sealing material to a sealing surface of the cover, which is subjected to the second processing step, the sealing surface defining a third sealing gap, and a pasty waterproof sealing material to a sealing surface of the connector housing, defining a second sealing gap; and a fourth processing step of mounting a base onto the cover, which is subjected to the third processing step, integrating and fixing the cover and the base, and sandwiching and fixing the circuit board by three sides of an outer periphery of the base and the three sides of an outer periphery of the cover, the second processing step comprising an additional processing step of applying, for a waterproof control unit comprising, as the circuit component, one of a first heat generating component mounted on a surface of the circuit board, which is opposed to the cover, and a second heat generating component mounted on a surface of the circuit board, which is opposed to the base, and comprising, on the base, one of a first heat transfer base portion adjacent to a bottom surface of the first heat generating component and a second heat transfer base portion adjacent to a back surface of the second heat generating component, a pasty heat conductive adhesive to a surface of the circuit board, which corresponds to one of the first heat transfer base portion and the second heat transfer base portion, the second sealing gap between the base and the connector housing and being a convexoconcave sealing surface having a concave thread mainly on the connector housing side, or including inner-step flat portions, slope portions, and outer-step flat portions, the third sealing gap between the base and the cover being a convexoconcave sealing surface having a concave thread mainly on the cover side, or including the inner-step flat portions, the slope portions, and outer-step flat portions, the method further comprising drying and curing, after finishing the fourth processing step, the pasty waterproof sealing materials by one of standing at room temperature and heating while carrying out visual inspection and performance inspection.

* * * * *